(12) United States Patent
Yokoyama

(10) Patent No.: US 10,573,424 B2
(45) Date of Patent: Feb. 25, 2020

(54) METHOD OF MANUFACTURING HIGH ASPECT RATIO STRUCTURE AND METHOD OF MANUFACTURING ULTRASONIC PROBE

(71) Applicant: KONICA MINOLTA INC., Chiyoda-ku (JP)

(72) Inventor: Mitsuru Yokoyama, Takatsuki (JP)

(73) Assignee: Konica Minolta, Inc., Tokyo (JP)

( * ) Notice: Subject to any disclaimer, the term of this patent is extended or adjusted under 35 U.S.C. 154(b) by 558 days.

(21) Appl. No.: 15/224,083

(22) Filed: Jul. 29, 2016

(65) Prior Publication Data

US 2017/0040076 A1 Feb. 9, 2017

(30) Foreign Application Priority Data

Aug. 5, 2015 (JP) .................................. 2015-154918

(51) Int. Cl.
| | | |
|---|---|---|
| *H01L 41/22* | (2013.01) | |
| *G21K 1/02* | (2006.01) | |
| *B81C 1/00* | (2006.01) | |
| *B06B 1/06* | (2006.01) | |

(52) U.S. Cl.
CPC ............ *G21K 1/025* (2013.01); *B06B 1/0662* (2013.01); *B81C 1/00571* (2013.01); *Y10T 29/42* (2015.01)

(58) Field of Classification Search
CPC .. B06B 1/0662; B81C 1/00571; G21K 1/025; G03F 7/2039; A61B 6/484; G01N 23/083; G02B 5/1838; G02B 5/1866; Y10S 430/167; Y10S 430/168; Y10T 29/42; Y10T 29/49826

USPC ....................................................... 29/25.35
See application file for complete search history.

(56) References Cited

U.S. PATENT DOCUMENTS

| 8,895,934 B2 | 11/2014 | Wang et al. | |
|---|---|---|---|
| 9,748,012 B2 * | 8/2017 | Yokoyama | G21K 1/02 |
| 2002/0109134 A1 * | 8/2002 | Iwasaki | B82Y 10/00 |
| | | | 257/13 |
| 2010/0198077 A1 * | 8/2010 | Ooura | A61B 8/08 |
| | | | 600/459 |
| 2013/0279651 A1 | 10/2013 | Yokoyama | |

FOREIGN PATENT DOCUMENTS

| JP | 11-187492 | 7/1999 |
|---|---|---|
| JP | 2001-194462 | 7/2001 |
| JP | 2010-285662 | 12/2010 |
| JP | 2011-172914 | 9/2011 |

(Continued)

OTHER PUBLICATIONS

Office Action dated Jul. 19, 2018 which issued in the corresponding Japanese Patent Application No. 2015-154918.

*Primary Examiner* — Thiem D Phan
(74) *Attorney, Agent, or Firm* — Cozen O'Connor

(57) ABSTRACT

A method of manufacturing a high aspect ratio structure includes: a hole forming step of forming a plurality of holes in at least one principal surface of a substrate; a resist forming step of forming a first area with a resist layer and a second area without the resist layer on the principal surface provided with the plurality of holes after the hole forming step ends; and a concave portion forming step of immersing the substrate into an etching solution to form a concave portion in the substrate corresponding to the second area.

4 Claims, 23 Drawing Sheets

(56) References Cited

FOREIGN PATENT DOCUMENTS

| | | |
|---|---|---|
| JP | 2013-057102 | 3/2013 |
| JP | 5420923 | 11/2013 |
| WO | WO 2012/008118 | 1/2012 |

* cited by examiner

TOP SURFACE

METHOD OF MANUFACTURING HIGH ASPECT RATIO STRUCTURE AND METHOD OF MANUFACTURING ULTRASONIC PROBE

The entire disclosure of Japanese Patent Application No. 2015-154918 filed on Aug. 5, 2015 including description, claims, drawings, and abstract are incorporated herein by reference in its entirety.

BACKGROUND OF THE INVENTION

Field of the Invention

The present invention relates to a method of manufacturing, for example, a high aspect ratio structure such as an ultrasonic probe manufacturing mold or an X-ray metal grid receiving an X-ray and a method of manufacturing an ultrasonic probe.

Description of the Related Art

For example, an X-ray metal grid which receives an X-ray is used in various devices in the form of an element including a plurality of parallel period structures and is further applied to an X-ray imaging device in recent years. In this X-ray imaging device, X-ray phase imaging has gained attention from the viewpoint of reducing the amount of radiation in recent years. In this case, as the X-ray grid, an absorbing grid which enables or disables the permeation of the X-ray to have a reliable contrast or a phase grid which has a reliable phase difference is needed. In order to realize these grids, a grid having a high aspect ratio structure with a high aspect ratio is needed. For that reason, a manufacturing method using silicon processing adopting a semiconductor processing technique is proposed. For example, WO 2012/008118 A discloses a metal grid manufacturing method. The metal grid manufacturing method disclosed in WO 2012/008118 A is a method of forming a concave portion (a slit) by a dry etching device and burying metal into the concave portion.

However, the dry etching device is expensive. Then, since the expensive dry etching device needs to be used in WO 2012/008118 A, the manufacturing cost increases. Particularly, when a large substrate such as an eight inch or more of a wafer is subjected to dry etching, the manufacturing cost further increases.

In that case, a method of manufacturing a grid by cheaper wet etching is considered. However, when the grid is manufactured by wet etching, a problem arises as below.

For example, when the concave portion is formed by general wet etching, as illustrated in FIGS. 29A and 29B, a portion other than a concave portion forming portion in one principal surface of a substrate 1000 provided with a concave portion is covered by a resist 1001 in accordance with patterning such as photolithography and is immersed into an etching solution 1002 capable of dissolving the substrate 1000 so that a portion not covered by the resist 1001 is dissolved. However, as illustrated in FIG. 29C, when the concave portion is formed at a position adjacent to the resist 1001, the dissolving action of the etching solution 1002 occurs isotropically in general. For this reason, the etching solution flows into the lower surface of the resist 1001 so that undercutting occurs and hence a concave portion 1003 having a side surface inclined with respect to the principal surface is formed. As a result, a problem arises in that a concave portion having a side surface perpendicular to the principal surface is not easily formed.

SUMMARY OF THE INVENTION

The present invention has been made in view of the above-described circumstances, and an object thereof is to provide a method of manufacturing a high aspect ratio structure with a concave portion having a side surface perpendicular to a principal surface of a substrate by wet etching and a method of manufacturing an ultrasonic probe.

The present inventor found that the above-described object is achieved by the following description of the present invention as a result of various examinations. To achieve the abovementioned object, according to an aspect, a method of manufacturing a high aspect ratio structure reflecting one aspect of the present invention comprises: a hole forming step of forming a plurality of holes in at least one principal surface of a substrate; a resist forming step of forming a first area with a resist layer and a second area without the resist layer on the principal surface provided with the plurality of holes after the hole forming step ends; and a concave portion forming step of immersing the substrate into an etching solution to form a concave portion in the substrate corresponding to the second area. Here, the high aspect ratio indicates a case in which the aspect ratio is five or more.

In such a method of manufacturing a high aspect ratio structure, a plurality of holes extending in a direction (a normal direction) perpendicular to a principal surface of a substrate are formed in the principal surface of the substrate and an etching solution is caused to permeate such a plurality of holes. Accordingly, since a dissolving action is conducted in a direction perpendicular to the depth direction of each hole, a partition wall between the holes can be removed and hence a concave portion having a side surface perpendicular to the principal surface of the substrate can be formed in the substrate corresponding to a second area. Thus, in the method of manufacturing a high aspect ratio structure, a diffraction grid, that is, a phase diffraction grid with a concave portion having a side surface perpendicular to the principal surface of the substrate can be easily manufactured at a low cost. Further, as will be described later, an ultrasonic probe manufacturing mold used to manufacture an ultrasonic probe can be easily manufactured at a low cost. Further, in the method of manufacturing a high aspect ratio structure, an X-ray absorbing portion can be formed in such a manner that an X-ray absorbing material having high X-ray permeability is buried into the concave portion and hence an absorption diffraction grid can be easily manufactured at a low cost.

According to another aspect of the present invention, in the method of manufacturing a high aspect ratio structure, the hole forming step is preferably performed by an anode oxidation treatment or an anode forming treatment.

In such a method of manufacturing a high aspect ratio structure of an X-ray metal grid, a plurality of holes perpendicular to the principal surface of the substrate can be easily formed in the principal surface.

According to another aspect of the present invention, in the method of manufacturing a high aspect ratio structure, the substrate is preferably formed of aluminum, tungsten, molybdenum, silicon, gallium arsenide, or indium-phosphorus.

In such a method of manufacturing a high aspect ratio structure, when the substrate is formed of aluminum, tungsten, molybdenum, silicon, gallium arsenide, or indium-phosphorus, a plurality of holes extending in a direction perpendicular to the principal surface can be easily formed in accordance with, for example, an anode oxidation treatment or an anode forming treatment.

According to another aspect of the present invention, in the method of manufacturing a high aspect ratio structure, the method of manufacturing a high aspect ratio structure preferably further comprises: an X-ray absorbing material burying step of burying an X-ray absorbing material capable of absorbing an X-ray into the concave portion.

In such a method of manufacturing a high aspect ratio structure, an X-ray absorbing portion can be formed in such a manner that a concave portion is formed in the substrate corresponding to a first area and an X-ray absorbing material is buried into the concave portion. Meanwhile, a portion including a plurality of holes in the substrate corresponding to a second area can be formed as an X-ray permeation portion.

According to another aspect of the present invention, in the method of manufacturing a high aspect ratio structure, in the X-ray absorbing material burying step, metal as the X-ray absorbing material is preferably buried by electroforming.

In such a method of manufacturing a high aspect ratio structure, an X-ray absorbing material such as metal can be easily and reliably buried into a concave portion in such a manner that the X-ray absorbing material is buried by electroforming.

According to another aspect of the present invention, in the method of manufacturing a high aspect ratio structure, the high aspect ratio structure is preferably an X-ray metal grid used in an X-ray Talbot interferometer or an X-ray Talbot-Lau interferometer.

In such a method of manufacturing a high aspect ratio structure, an X-ray metal grid including a zeroth grid, a first grid, and a second grid used in an X-ray Talbot interferometer or an X-ray Talbot-Lau interferometer exhibiting higher performance can be manufactured.

According to another aspect of the present invention, in the method of manufacturing a high aspect ratio structure, the high aspect ratio structure is preferably an ultrasonic probe manufacturing mold used when an ultrasonic probe is manufactured.

In such a method of manufacturing a high aspect ratio structure, an ultrasonic probe manufacturing mold used to manufacture an ultrasonic probe can be easily manufactured at a low cost.

To achieve the abovementioned object, according to an aspect, a method of manufacturing an ultrasonic probe reflecting one aspect of the present invention comprises: a metal mold forming step of charging metal into the concave portion of the ultrasonic probe manufacturing mold described above to form a metal mold with a metal mold concave portion; a resin mold forming step of charging resin filler formed of a resin material into the metal mold concave portion of the metal mold to form a resin mold with a resin mold concave portion; a microscopic structure forming step of charging slurry including a piezoelectric material into the resin mold concave portion of the resin mold to form a microscopic structure with a structure concave portion; and an ultrasonic probe body forming step of charging synthetic resin into the structure concave portion of the microscopic structure to form an ultrasonic probe body in which a piezoelectric layer formed of a piezoelectric material and a synthetic resin layer formed of synthetic resin are arrayed alternately.

In such a method of manufacturing an ultrasonic probe, an ultrasonic probe body in which a piezoelectric layer and a synthetic resin layer are accurately and alternately arrayed can be manufactured based on an ultrasonic probe manufacturing mold with a plurality of concave portions formed to have a side surface perpendicular to one principal surface of a substrate by wet etching and can be manufactured at a low cost.

BRIEF DESCRIPTION OF THE DRAWINGS

The above and other objects, advantages and features of the present invention will become more fully understood from the detailed description given hereinbelow and the appended drawings which are given by way of illustration only, and thus are not intended as a definition of the limits of the present invention, and wherein.

DESCRIPTION OF THE PREFERRED EMBODIMENTS

Figure 1:
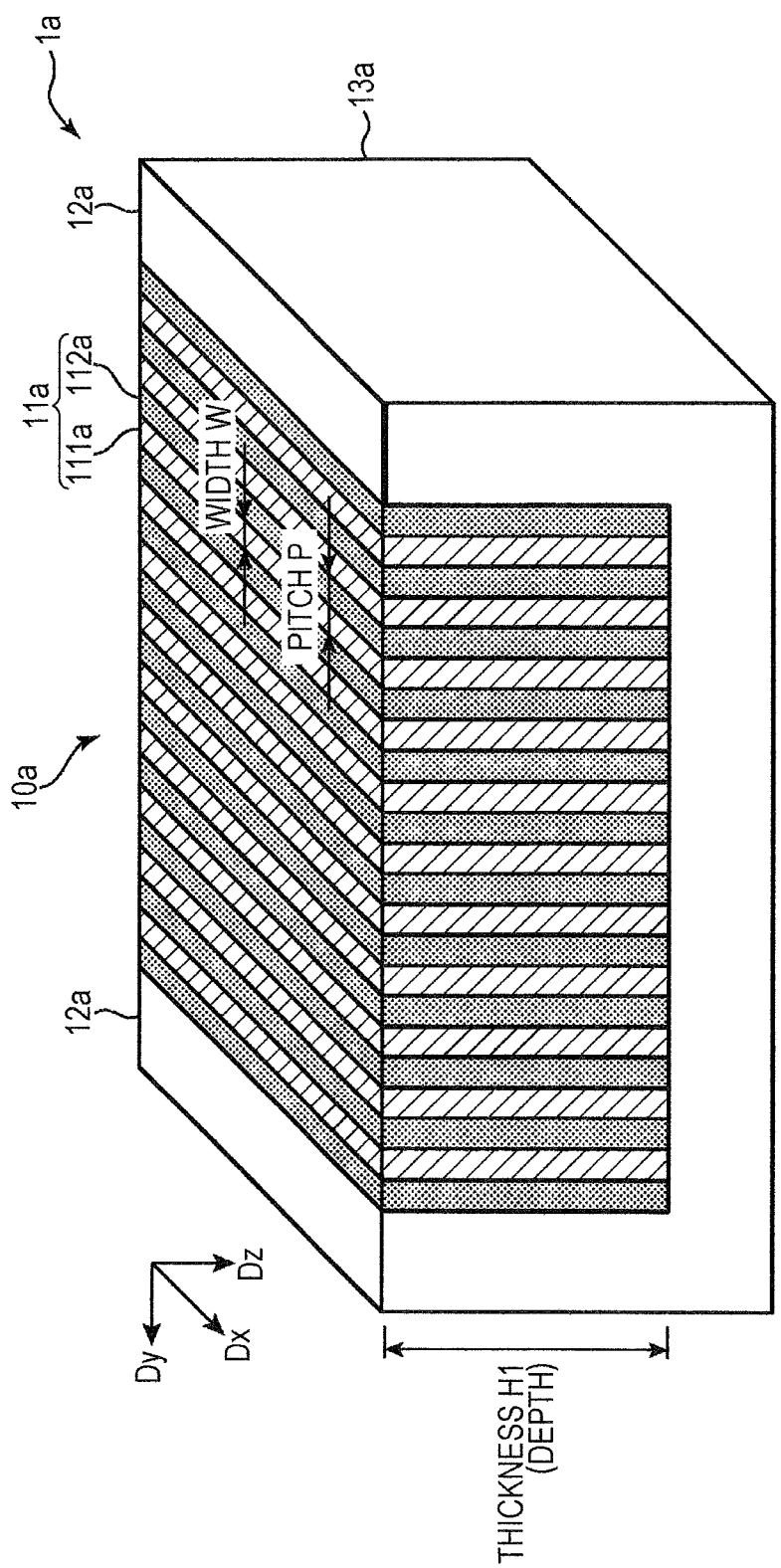
FIG. 1 is a perspective view illustrating a configuration of an X-ray metal grid according to a first embodiment of the present invention which is manufactured by a method of manufacturing a high aspect ratio structure according to an embodiment of the present invention.

Hereinafter, an embodiment of the present invention will be described with reference to the drawings. However, the scope of the invention is not limited to the illustrated examples. Further, the components denoted by the same reference numerals in the drawings are similar to one another and hence the description thereof will be omitted appropriately. In the present specification, when the components are called generally, the components are denoted by the reference numerals without the suffixes. Meanwhile, when the components are called individually, the components are denoted by the reference numerals with the suffixes.

(First Embodiment of X-ray Metal Grid)

FIG. 1 is a perspective view illustrating a configuration of an X-ray metal grid as an example manufactured by a method of manufacturing a high aspect ratio structure according to an embodiment of the present invention. A metal grid 1a includes, as illustrated in FIG. 1, a grid area 10a and a frame area 12a formed in an X-ray metal substrate 13a. The grid area 10a is an area provided with a grid 11a and the frame area 12a is formed in the periphery of the grid area 10a so as to surround the grid area 10a.

As illustrated in FIG. 1, on the assumption that the orthogonal coordinate DxDyDz is set, the grid ha includes a plurality of X-ray absorbing portions 111a which have a predetermined thickness (a depth) H1 (a length in a direction Dz perpendicular to a grid plane DxDy (a normal direction of the grid plane DxDy)) and extend linearly in one direction Dx and a plurality of X-ray permeation portions 112a which extend linearly in the one direction Dx, and the plurality of X-ray absorbing portions 111a and the plurality of X-ray permeation portions 112a are disposed alternately in parallel. For this reason, the plurality of X-ray absorbing portions 111a are disposed in a direction Dy orthogonal to the one direction Dx with a predetermined gap interposed therebetween. In other words, the plurality of X-ray absorbing portions 111a are disposed in the direction Dy orthogonal to the one direction Dx with a predetermined gap interposed therebetween. The predetermined gap (the pitch) P is uniform in the embodiment. That is, the plurality of X-ray absorbing portions 111a are disposed in the direction Dy orthogonal to the one direction Dx at the same gap P. Further, in the embodiment, each of the plurality of X-ray absorbing portions 111a is formed in a plate shape or a layered shape along a plane DxDz orthogonal to the plane DxDy and each of the plurality of X-ray permeation portions 112a each interposed between the adjacent X-ray absorbing portions 111a is formed in a plate shape or a layered shape along the plane DxDz.

The plurality of X-ray absorbing portions 111a are used to absorb X-rays and the plurality of X-ray permeation portions 112a are used to permeate the X-rays. For this reason, as one kind, such an X-ray metal grid 1a can be used as a general grid which does not cause an interference fringe in that a pitch P is sufficiently long with respect to the wavelength of the X-ray and hence can be used as, for example, a zeroth grid in an X-ray Talbot-Lau interferometer. Further, as the other kind, such an X-ray metal grid 1a serves as a diffraction grid when the predetermined gap P is set appropriately in response to the wavelength of the X-ray and hence can be used as, for example, first and second grids of the X-ray Talbot-Lau interferometer or an X-ray Talbot interferometer. The X-ray absorbing portion 111a has an appropriate thickness H1 in order to sufficiently absorb the X-ray in response to, for example, a specification. Since the permeability of the X-ray is generally high, a ratio of the thickness H1 with respect to the width W of the X-ray absorbing portion 111a (aspect ratio=thickness/width) is set to, for example, a high aspect ratio of five or more. The width W of the X-ray absorbing portion 111a is the length of the X-ray absorbing portion 111a in a direction (the width direction) Dy orthogonal to the one direction (the longitudinal direction) Dx and the thickness H1 is the length of the X-ray absorbing portion 111a in the normal direction (the depth direction) Dz of the plane DxDy formed by the one direction Dx and the direction Dy orthogonal thereto.

Such an X-ray metal grid 1a is manufactured by a hole forming step of forming a hole group including a plurality of holes on at least one principal surface of a metal substrate, a resist forming step of forming a first area with a resist layer and a second area without the resist layer in the surface provided with the hole group after the hole forming step ends, a concave portion forming step of forming a concave portion in a substrate corresponding to the second area by immersing the substrate into an etching solution capable of dissolving the substrate, and an X-ray absorbing material burying step of burying an X-ray absorbing material into the concave portion. The concave portion is, for example, a slit groove in a one-dimensional grid and is a pillar hole in a two-dimensional grid. Hereinafter, a method of manufacturing the X-ray metal grid 1a in which the concave portion is the slit groove will be described. Further, the same applies to a case in which the concave portion has another shape, for example, the shape of the pillar hole.

Figure 8A:
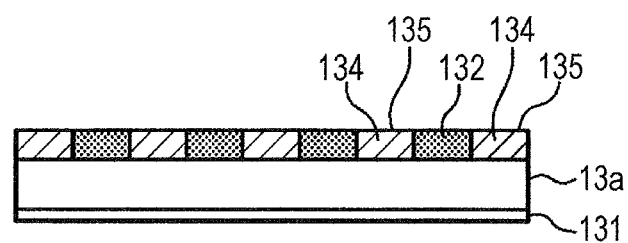
FIGS. 8A and 8B are (seventh) diagrams illustrating a method of manufacturing the X-ray metal grid according to the first embodiment of the present invention of FIG. 1.
Figure 8B:
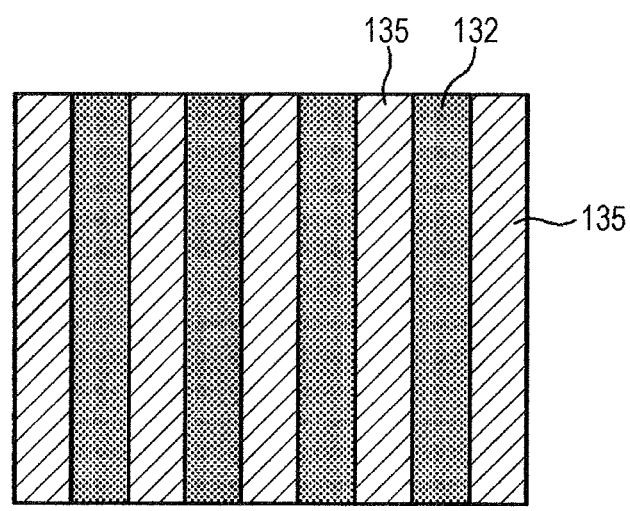
Figure 9:
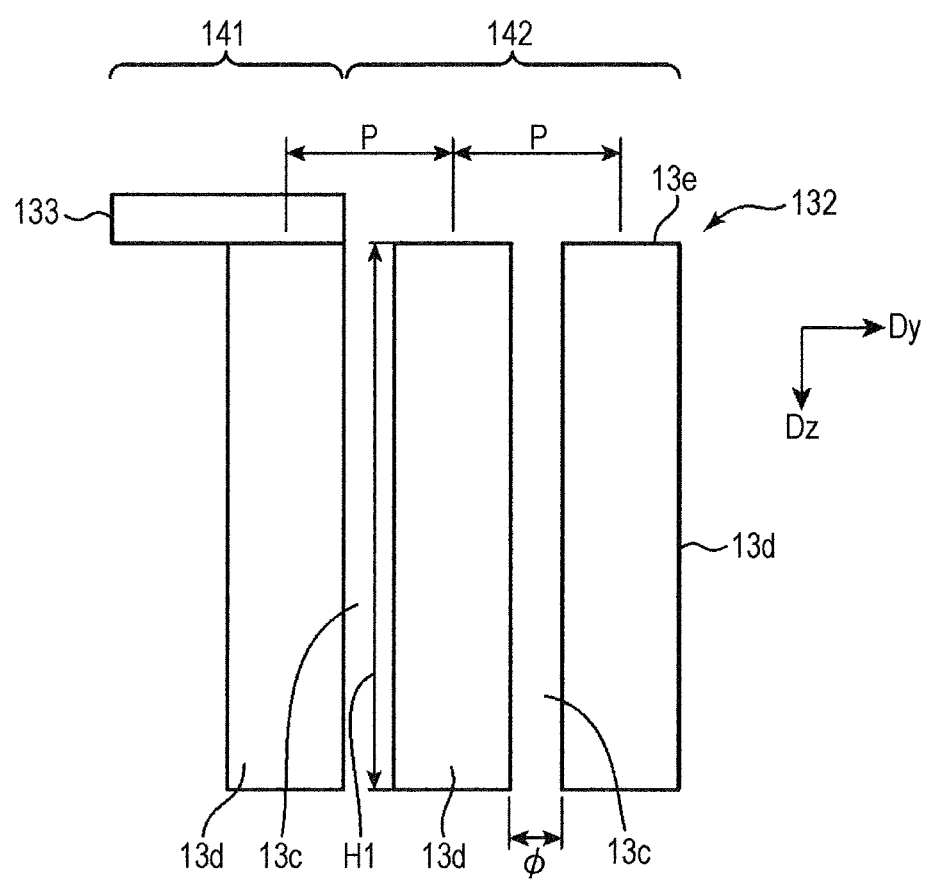
FIG. 9 is an enlarged view illustrating a main part of FIGS. 6A and 6B.
Figure 10:
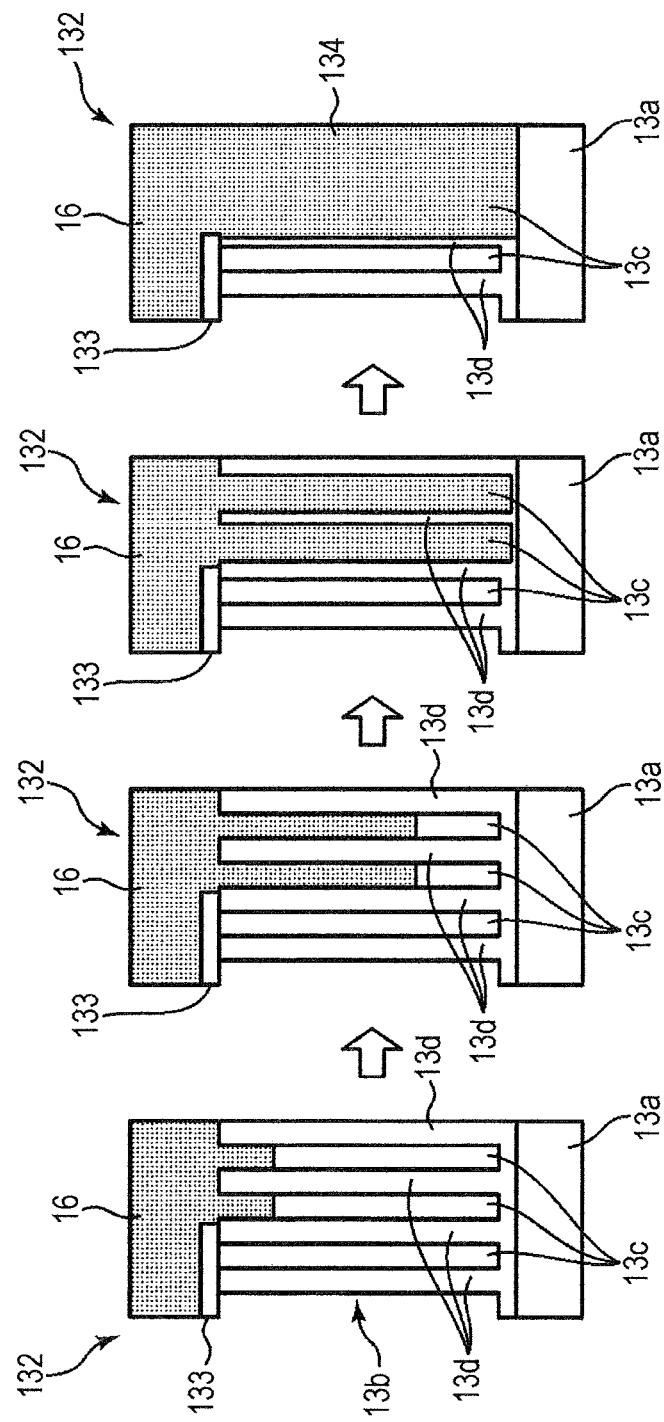
FIGS. 10A to 10D are explanatory diagrams illustrating a case in which a concave portion is formed in the X-ray metal grid according to the first embodiment of the present invention of FIG. 1.
Figure 11:
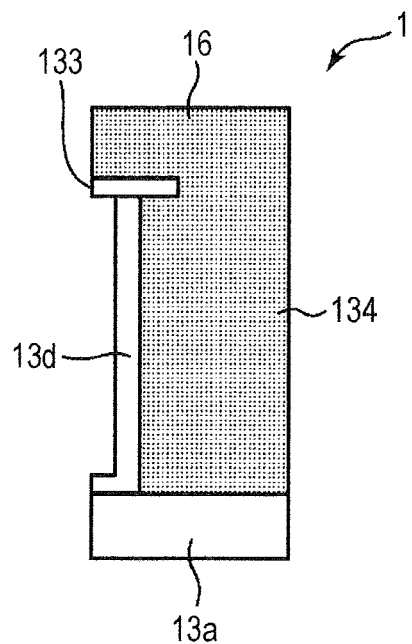
FIG. 11 is an explanatory diagram illustrating a case in which a partition wall adjacent to a portion corresponding to a second area in a first area of a substrate used in the X-ray metal grid is dissolved when the concave portion is formed in the X-ray metal grid according to the first embodiment of the present invention of FIG. 1.
Figure 12:
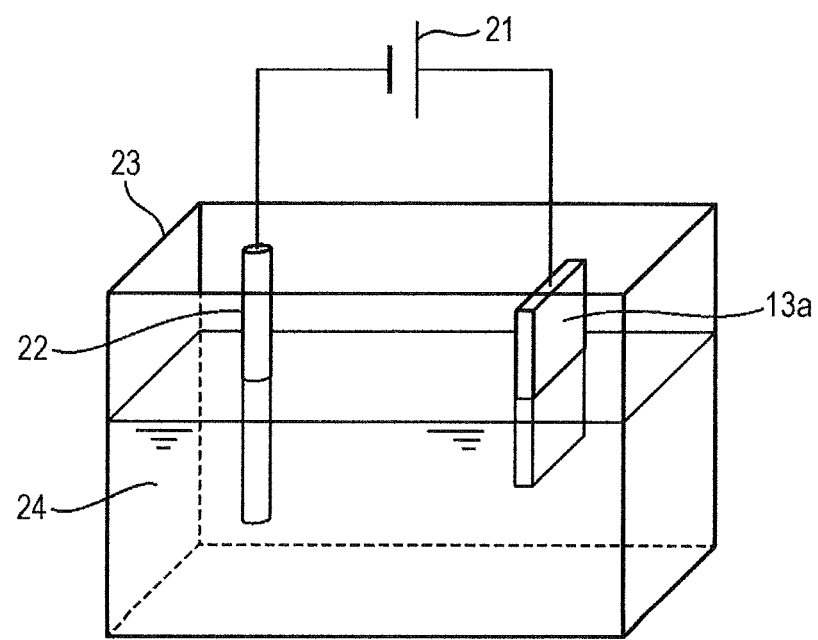
FIG. 12 is a diagram illustrating an anode oxidation treatment used to form a plurality of holes in a metal substrate.
Figure 13:
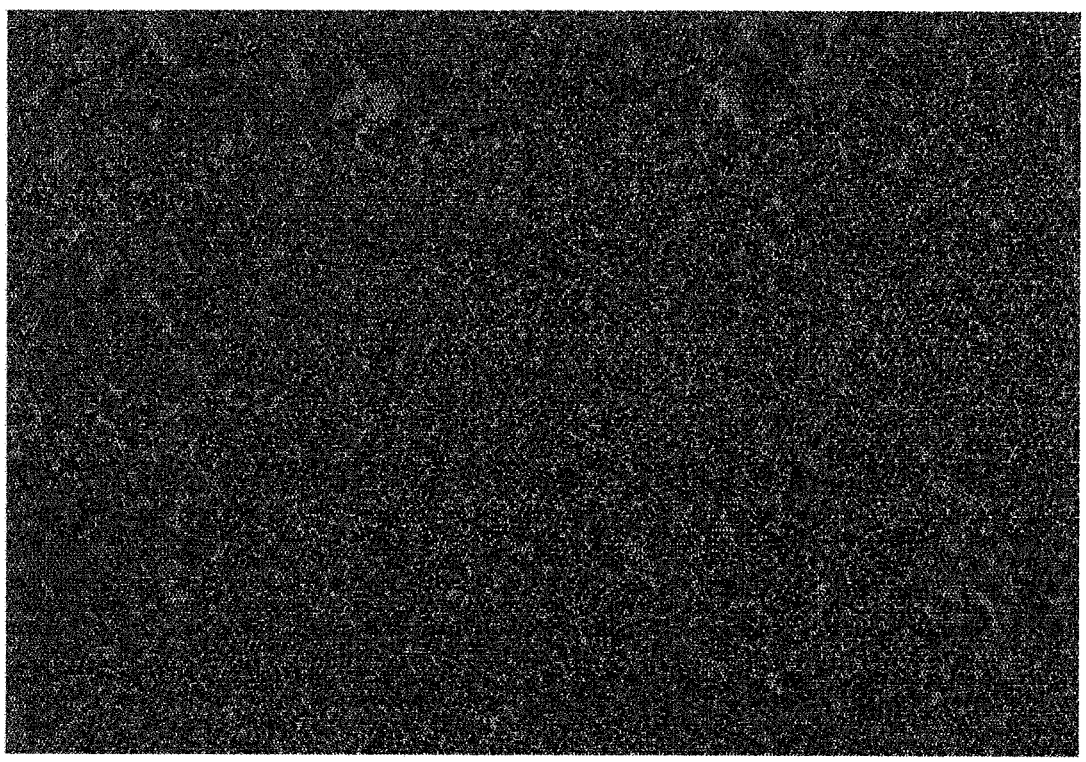
FIG. 13 is a diagram illustrating a top surface of a metal substrate with a plurality of holes formed in accordance with an anode oxidation treatment as an example.

FIGS. 2A and 2B to FIG. 11 are diagrams illustrating a method of manufacturing the X-ray metal grid according to the first embodiment. Each of pairs of FIGS. 2A and 2B to FIGS. 8A and 8B schematically illustrates each manufacturing step. Here, FIGS. 2A, 3A, 4A, 5A, 6A, 7A and 8A are cross-sectional views of FIGS. 2B, 3B, 4B, 5B, 6B, 7B and 8B, respectively, and FIGS. 2B, 3B, 4B, 5B, 6B, 7B and 8B are top views. FIG. 9 is an enlarged view of a main part of FIGS. 6A and 6B and FIGS. 10A to 10D are explanatory diagrams illustrating a case in which the concave portion is formed. Further, FIG. 11 is an explanatory diagram illustrating a case in which a partition wall of a portion corresponding to the first area adjacent to a portion corresponding to the second area in the substrate is dissolved. Further, FIG. 12 is a diagram illustrating an anode oxidation treatment which forms a plurality of holes in a metal substrate. FIG. 13 is a diagram illustrating a top surface of a metal substrate with a plurality of holes formed in accordance with the anode oxidation treatment as an example.

Figure 2A:
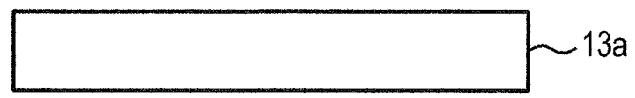
FIGS. 2A and 2B are (first) diagrams illustrating a method of manufacturing the X-ray metal grid according to the first embodiment of the present invention of FIG. 1.
Figure 2B:
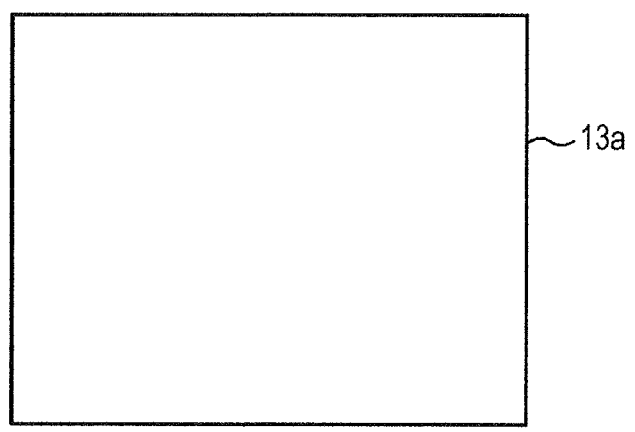

In order to manufacture the X-ray metal grid $1a$ according to the first embodiment, the metal substrate (the substrate) $13a$ having a plate shape is prepared first (FIGS. 2A and 2B). The metal substrate $13a$ is formed of metal (including alloy and compound) capable of forming a plurality of holes therein in accordance with an anode oxidation treatment or an anode forming treatment. In this manufacturing method, as will be described later, a portion subjected to the anode oxidation step is formed as the X-ray permeation portion $112a$ of the grid $11a$. Accordingly, it is desirable that the metal substrate $13a$ be formed of metal (including alloy) having comparatively high permeability with respect to the X-ray. From the viewpoint of the anode oxidation treatment and the high X-ray permeability (the X-ray permeation characteristic), the metal substrate $13a$ is desirably formed of, for example, aluminum (Al). In this example, the metal substrate $13a$ is formed of aluminum.

Figure 3A:
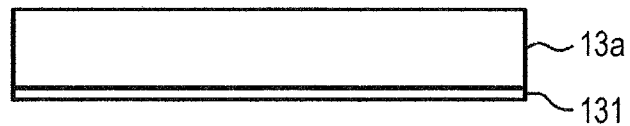
FIGS. 3A and 3B are (second) diagrams illustrating a method of manufacturing the X-ray metal grid according to the first embodiment of the present invention of FIG. 1.
Figure 3B:
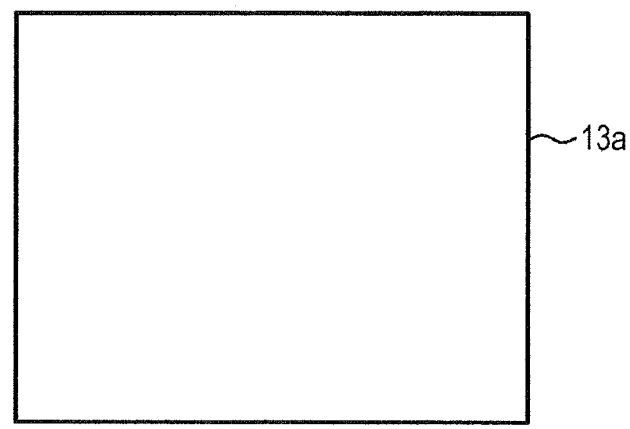

Next, a quartz (silicon dioxide, $SiO_2$) film as a resist layer 131 is formed on one principal surface of the metal substrate $13a$ as illustrated in FIGS. 3A and 3B. The quartz film is formed in accordance with, for example, various film forming methods such as chemical vapor deposition (CVD) and sputtering which are generally known in this field. For example, in the embodiment, a quartz film is formed by plasma CVD using tetraethoxysilane. More specifically, tetraethoxysilane (TEOS) as one kind of organic silane is heated and is bubbled by a carrier gas to thereby produce a TEOS gas. Then, the TEOS gas is mixed with, for example, an oxidation gas such as oxygen or ozone and, for example, a dilution gas such as helium so that a raw material gas is produced. Then, this raw material gas is introduced into, for example, a plasma CVD device so that a quartz film 131 having a predetermined thickness (in this embodiment, 2 μm) is formed on a front surface of the metal substrate $13a$ inside the plasma CVD device.

Further, in the description above, the resist layer 131 is the quartz film, but the present invention is not limited thereto. Since the resist layer 131 is a protection layer which serves as a protection film of the metal substrate $13a$ against an acid solution used in an anode oxidation treatment when the anode oxidation treatment is performed in the anode oxidation step, the resist layer 131 may have such a function and may be formed of, for example, a metal film or a dielectric material such as silicon nitride (SiN).

Figure 4A:
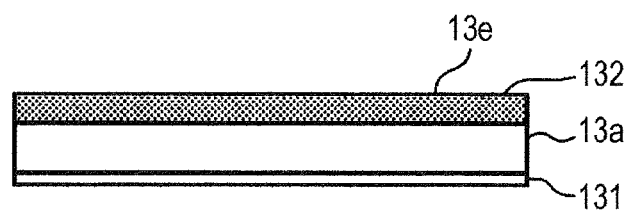
FIGS. 4A and 4B are (third) diagrams illustrating a method of manufacturing the X-ray metal grid according to the first embodiment of the present invention of FIG. 1.
Figure 4B:
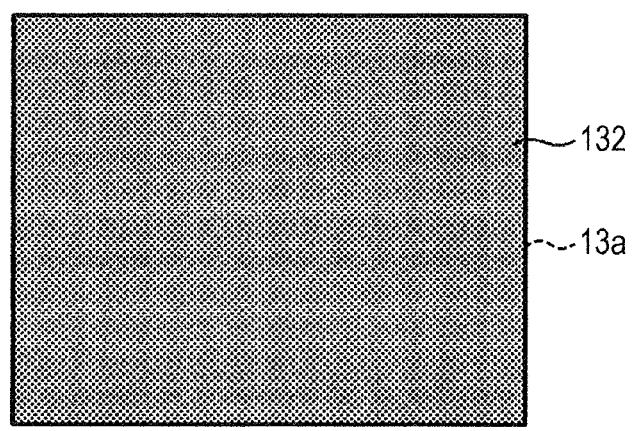
Figure 5A:
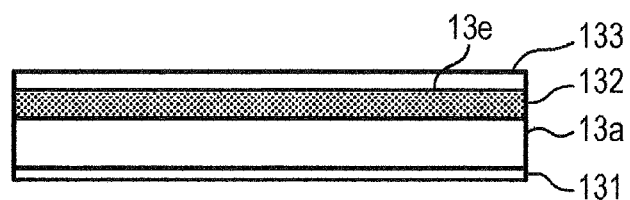
FIGS. 5A and 5B are (fourth) diagrams illustrating a method of manufacturing the X-ray metal grid according to the first embodiment of the present invention of FIG. 1.
Figure 5B:
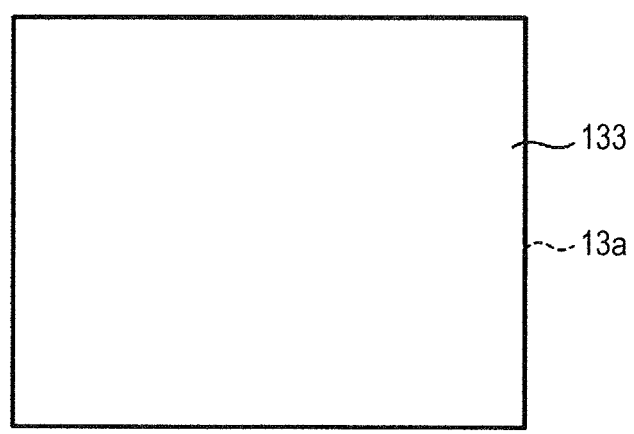

Next, a hole group 132 having a plurality of holes is formed in the other principal surface of the metal substrate $13a$ in accordance with the anode oxidation treatment (an anode oxidation step illustrated in FIGS. 4A and 4B).

More specifically, in this anode oxidation step, as an example, as illustrated in FIG. 12, an anode of a power supply 21 is electrically connected to the metal substrate $13a$ provided with the resist layer 131, and a cathode electrode 22 and the metal substrate $13a$ connected to a cathode of the power supply 21 are immersed into an electrolyte 24 inside a water tank 23 filled with the electrolyte 24. At that time, the cathode electrode 22 and the metal substrate $13a$ are immersed into the electrolyte 24 so that the cathode electrode 22 faces the other principal surface (a surface without the resist layer 131) of the metal substrate $13a$. It is desirable that the electrolyte 24 be, for example, an etching solution such as phosphoric acid and oxalic acid which correspond to an acid solution dissolving a metal oxide film formed in accordance with the anode oxidation treatment and having strong oxidizability. It is desirable that the cathode electrode 22 be formed of metal, for example, gold (Au) and platinum (Pt) which are not dissolved in the electrolyte 24. As an example, the electrolyte 24 is an oxalic acid solution of 0.1 M (mol concentration, mol/l) with respect to the metal substrate $13a$ formed of aluminum and the cathode electrode 22 is a titanium plate plated with platinum. Then, when a current is supplied to the metal substrate $13a$, a plurality of holes $13c$ extending inward from a front surface $13e$ of the metal substrate $13a$ are formed. In the embodiment, when a current is supplied to the metal substrate $13a$, a plurality of holes which extend from the front surface $13e$ of the metal substrate $13a$ in the thickness direction of the metal substrate $13a$ (a direction Dz perpendicular to the front surface) are formed with a gap therebetween as illustrated in FIGS. 4A and 4B and FIG. 9. As an example, a DC voltage of about 20 V is applied across the cathode electrode 22 and the metal substrate $13a$ for about 10 hours so that a plurality of holes each having a diameter $\phi$ of about 20 nm and a depth H1 of about 80 μm are formed with a gap therebetween so that an average pitch distance p becomes about 60 nm. A top surface of an example thereof is illustrated in FIG. 13. In FIG. 13, a picture obtained by a scanning electron microscope (SEM) is illustrated as a drawing.

Figure 6A:
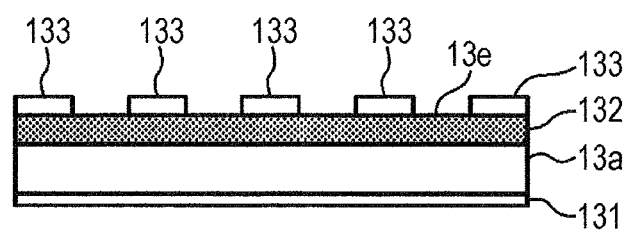
FIGS. 6A and 6B are (fifth) diagrams illustrating a method of manufacturing the X-ray metal grid according to the first embodiment of the present invention of FIG. 1.
Figure 6B:
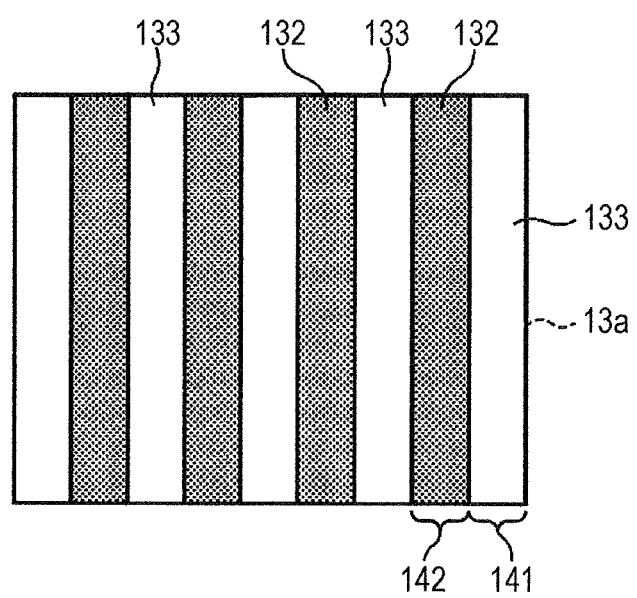
Figure 7A:
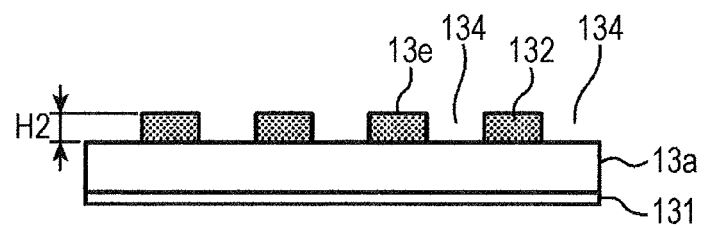
FIGS. 7A and 7B are (sixth) diagrams illustrating a method of manufacturing the X-ray metal grid according to the first embodiment of the present invention of FIG. 1.
Figure 7B:
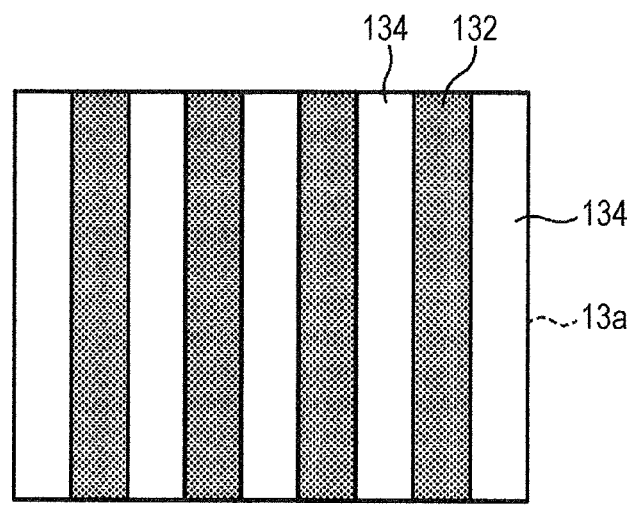

Next, a dry film resist is adhered onto the surface of the metal substrate $13a$ provided with the hole group 132 (FIGS. 5A and 5B) and a resist layer 133 is formed by the dry film resist having a line and space pattern with a period of 5.3 μm and a duty ratio of 50% in accordance with photolithography (FIGS. 6A and 6B). Accordingly, a first area 141 with the resist layer 133 and a second area 142 without the resist layer 133 are formed on the surface of the metal substrate $13a$ provided with the hole group 132 (a resist forming step).

Next, the metal substrate $13a$ with the resist layer 133 is immersed into 5 vol % of a phosphoric acid solution (an etching solution 16) and is left for 240 minutes. At this time, when several seconds to several minutes elapse from a time point in which the metal substrate $13a$ is immersed into the phosphoric acid solution 16, the phosphoric acid solution 16 permeates the holes $13c$ of the hole group 132 exposed by the above-described photolithography patterning as illustrated in FIGS. 10A, 10B, and 10C.

Next, etching is performed isotropically inside the holes $13c$ filled with the phosphoric acid solution 16 for the remaining time (≈240 minutes) as illustrated in FIG. 10D, and hence a partition wall $13d$ between two adjacent holes $13c$ is dissolved. Accordingly, a concave portion 134 is formed in the substrate $13a$ corresponding to the second area 142 (a concave portion forming step illustrated in FIGS. 7A and 7B).

At that time, the phosphoric acid concentration of the phosphoric acid solution 16 is set so that the time necessary for the phosphoric acid solution 16 to permeate the hole $13c$ is shorter than the time taken until the phosphoric acid solution 16 completely dissolves the partition wall $13d$ (where the time necessary for phosphoric acid solution 16 to permeate the hole 13c is shorter than the time necessary for the phosphoric acid solution 16 to completely dissolve the partition wall 13d). Thus, since the partition wall 13d disappears at a time point in which the partition wall 13d is dissolved from both sides thereof by the action of etching so that the partition wall is dissolved by 20 nm (a half of the thickness of the partition wall) from both sides and is removed, the partition wall 13d adjacent to a portion corresponding to the second area 142 in a portion corresponding to the first area 141 covered by the resist layer 133 is still left by 20 nm as a half of the thickness at a time point in which the partition wall 13d disappears. Even when the etching is further performed in this state, a portion corresponding to the thickness of 20 nm does not disappear if a long time like 240 minutes does not elapse. Even when the portion corresponding to the thickness of 20 nm disappears due to the excessive etching, this can be regarded as an error range which does not cause any problem in practical use in that the width of the concave portion 134 is widened by 120 nm in maximum due to the average pitch distance of 60 nm between the holes 13c.

Further, even when etching is performed excessively, a portion corresponding to one period of the hole 13c is etched as an extra, that is, the partition wall 13d adjacent to a portion corresponding to the second area 142 in a portion of the partition wall 13d corresponding to the first area 141 is etched as illustrated in FIG. 11.

In this example, since the phosphoric acid solution 16 having a concentration as small as 5 vol % is used, the etching time is 240 minutes. However, for example, in the case of the phosphoric acid solution 16 of 15 vol %, the etching time becomes about 70 minutes. In this way, the etching time becomes shorter as the concentration becomes higher. Even in this case, since 70 minutes are further taken in order to perform the etching for another period so that the etching time is sufficiently longer than the time in which the etching solution (=the phosphoric acid solution 16) is charged into the hole 13c at the early time of the etching, the possibility that the controllability disappears noticeably is low.

Further, in this example, the resist layer 131 formed as the quartz film is formed on one principal surface in advance so that the hole group 132 is formed only in the other principal surface due to the anode oxidation. However, in order to suppress a change in surface accuracy due to oxidation, the hole group 132 may be formed in both one and the other principal surfaces. In this case, the hole group 132 may be formed in both surfaces and then a surface not subjected to patterning may be coated with quartz by, for example, a technique such as TEOS-CVD.

Next, an X-ray absorbing material 135 capable of absorbing an X-ray is buried into the concave portion 134 (an X-ray absorbing material burying step illustrated in FIGS. 8A and 8B). In this embodiment, since the side wall of the concave portion 134 has aluminum oxide (an insulation material) and the bottom portion thereof has aluminum (a conductive material), bottom-up electroplating (electroforming) can be performed from the bottom portion. For that reason, in this embodiment, gold is selected as the X-ray absorbing material 135 and gold is buried into the concave portion 134 by plating. Further, in this example, gold is used as a plating material, but metal such as platinum or rhodium/iridium having a high X-ray absorbing property and used for plating may be selected. Further, a method of causing gold powder or the like to flow into the concave portion 134 may be also used. Accordingly, the X-ray absorbing material 135 is buried into the concave portion 134 to thereby form the X-ray absorbing portion 111a.

Further, in the method of manufacturing the X-ray metal grid 1a according to the first embodiment, the plurality of holes respectively extend in the thickness direction of the metal substrate 13a. The plurality of holes can be formed to have, for example, a comparatively long length of several hundreds of micron meters in accordance with an anode oxidation treatment. For this reason, in the method of manufacturing the X-ray metal grid 1a according to the first embodiment, since the plurality of holes extend in the thickness direction of the metal substrate 13a, the X-ray permeation portion 112a having, for example, a high aspect ratio of five or more can be formed.

Further, in the embodiment, the X-ray absorbing material is buried into the concave portion to manufacture the absorbing grid. However, in the case of a phase grid, the phase grid can be used while a concave portion having an appropriate depth is formed.

Further, in the embodiment, a plate-shaped portion 17 without the X-ray absorbing portion 111a and the X-ray permeation portion 112a is provided at one side of the metal substrate 13a. However, as illustrated in FIGS. 15A and 15B, the plate-shaped portion 17 may be removed and a support substrate 14 having high X-ray permeability may be disposed at the opposite side to the plate-shaped portion 17 in the metal substrate 13a.

Figure 14:
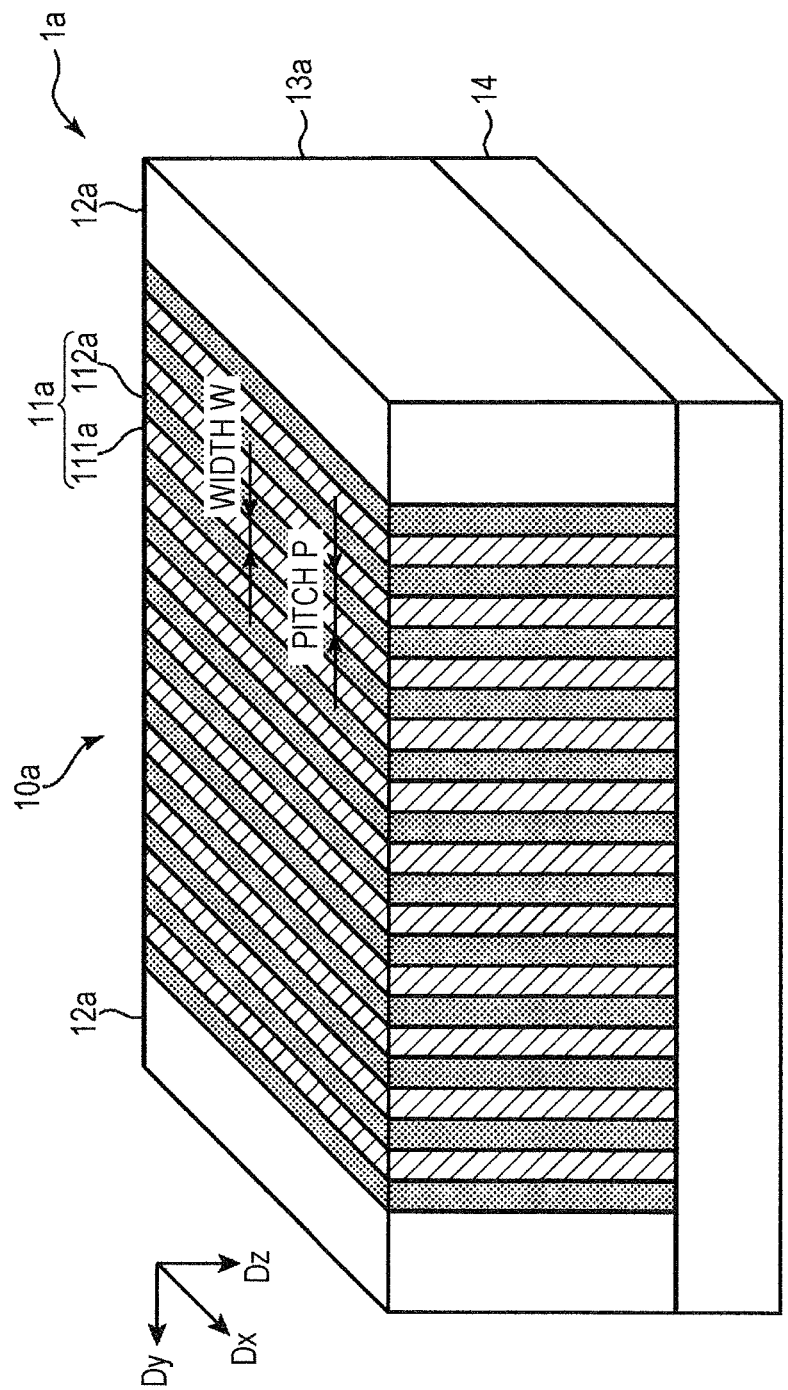
FIG. 14 is a perspective view illustrating a modified example of the X-ray metal grid according to the first embodiment of the present invention.
Figure 15A:
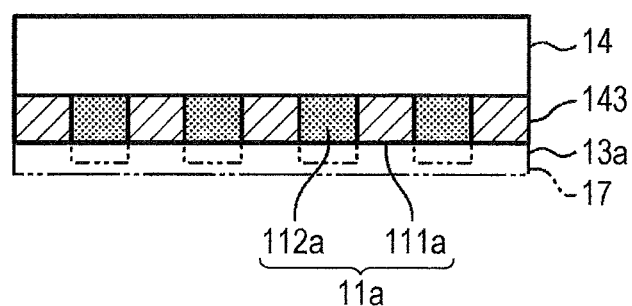
FIGS. 15A and 15B are diagrams illustrating a method of manufacturing a modified example of the X-ray metal grid of FIG. 14.
Figure 15B:
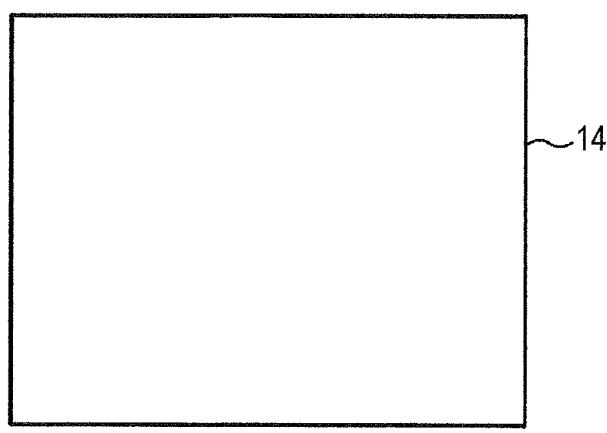

Specifically, for example, the X-ray absorbing material is buried into the concave portion 134 to form the X-ray absorbing portion 111a and then a different support substrate 14, for example, an acrylic plate having higher permeability with respect to the X-ray than the metal substrate 13a (formed of aluminum in the above-described embodiment) as a base material is adhered to one side opposite to the plate-shaped portion 17 in the metal substrate 13a as illustrated in FIGS. 15A and 15B. Further, the plate-shaped portion 17 in the metal substrate 13a is polished to remove the plate-shaped portion 17. Accordingly, the X-ray metal grid 1a including the support substrate 14 having high X-ray permeability and different from the metal substrate 13a illustrated in FIG. 14 is obtained. In this way, the X-ray permeability may be improved.

Further, in the embodiment, the substrate 13a is formed of aluminum, but the invention is not limited thereto. That is, the material can be appropriately modified as long as the hole group 132 can be formed of the material in accordance with a chemical treatment. For example, a semiconductor substrate of silicon or gallium arsenide may be used.

For example, when anodization is performed at a voltage of 12 V while an n-type GaAs (001) substrate is irradiated with light by a tungsten lamp in the presence of $NH_4OH$ and a magnetic field is applied thereto, a hole group including vertical holes of about 250 nm of pitch is obtained. Since the concave portion 134 can be formed as in the above-described example in such a manner that such a substrate is subjected to patterning by photolithography in the same way as described above and is subjected to wet etching by a mixed solution of sulfuric acid and hydrogen peroxide, the grid which is manufactured in this way may be used as a phase grid.

Further, when the hole group including the plurality of holes is formed, a method of forming the hole group while a material forming the hole group flows as an anode in an acid solution is used in many cases. However, the case of silicon or gallium arsenide (GaAs) in which a substrate is not oxidized by this reaction is referred to as "anodization" as described above.

Further, as described above, when the substrate is replaced by the substrate having high permeability at the final processing step, a material having X-ray permeability worse than aluminum such as molybdenum may be used as the anode oxidation material. This is because the permeation portion of the grid is formed in a porous structure having fine holes. Thus, even when the X-ray permeability of the base material is poor, the permeability can be ensured sufficiently. Here, when abase material having poor permeability is left as the substrate, there is a concern that a contrast between permeation and non-permeation may be degraded. Thus, when the base material has poor X-ray permeability, it is desirable to replace the substrate by the substrate having high permeability at the final processing step as described above.

Further, in the embodiment, the X-ray absorbing material is formed of gold (Au), but the invention is not limited to the embodiment. Then, the X-ray absorbing material can be appropriately modified. The X-ray absorbing material may be formed of, for example, metal or noble metal having low X-ray permeability and relatively high atomic weight. More specifically, for example, platinum (Pt), rhodium (Rh), ruthenium (Ru), and iridium (Ir) may be used.

Further, in the first embodiment (including these modified examples), the X-ray metal grid 1a has a one-dimensional periodic structure, but the present invention is not limited thereto. The X-ray metal grid 1a may be also, for example, a grid having a two-dimensional periodic structure. For example, the X-ray metal having a two-dimensional periodic structure is formed so that dots forming the two-dimensional periodic structure are linearly disposed in two independent directions at the same interval with a predetermined gap therebetween. The X-ray metal grid having such a two-dimensional periodic structure can be formed in such a manner that high aspect ratio holes are opened at a two-dimensional period in plane or high aspect ratio circular pillars are uprightly formed at a two-dimensional period in plane. Alternatively, metal may be buried into these spaces as described above.

Figure 16A:
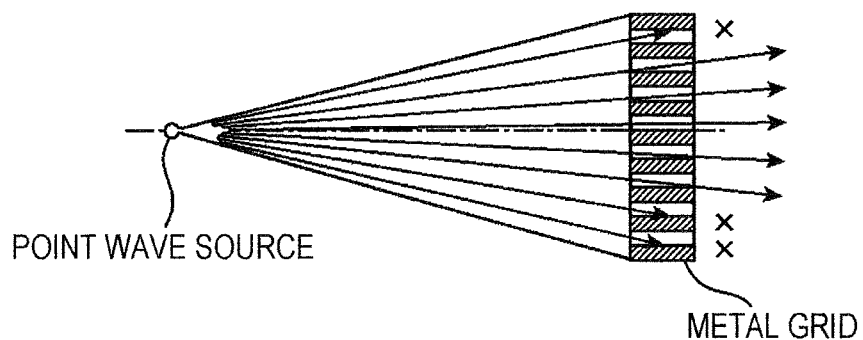
FIGS. 16A and 16B are diagrams illustrating the vignetting of X-rays emitted from an X-ray source in the X-ray metal grid.
Figure 16B:
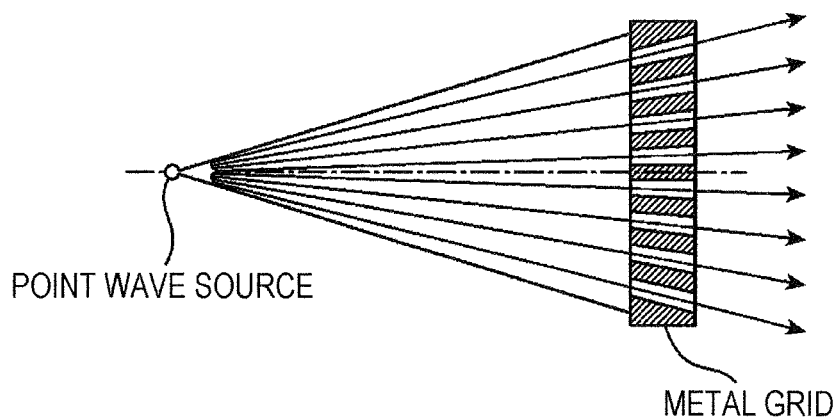

FIGS. 16A and 16B are diagrams illustrating the vignetting of the X-rays emitted from an X-ray source in the X-ray metal grid.

FIG. 16A illustrates the case of the X-ray metal grid including the X-ray permeation portion extending in the normal direction and formed by the portions of the plurality of holes extending in the normal direction and FIG. 16B illustrates the case of the X-ray metal grid including the X-ray permeation portion extending so as to converge toward the focal point of the X-ray and formed by the portions of the plurality of holes extending so as to converge toward the focal point of the X-ray. Generally, the X-ray source is a point wave source and emits the X-ray radially as illustrated in FIGS. 16A and 16B. For this reason, the X-ray metal grid is formed as a flat plate shape and the plurality of holes extend in the normal direction. Then, when the X-ray source is disposed on the normal line passing through the center of the X-ray metal grid, the X-ray is obliquely incident into the X-ray permeation portion including the portion with the plurality of holes formed therein as it goes from the center toward the periphery as illustrated in FIG. 16A. As a result, so-called vignetting occurs. In the method of manufacturing the X-ray metal grid, since the plurality of holes are formed so as to converge toward the focal point of the X-ray as illustrated in FIG. 16B, the vignetting can be reduced.

(Second and Third Embodiments: Talbot Interferometer and Talbot-Lau Interferometer)

Since the X-ray metal grid 1a of the above-described embodiment can form a metal portion by a high aspect ratio, the metal grid can be appropriately used in the Talbot interferometer and the Talbot-Lau interferometer for the X-ray. The X-ray Talbot interferometer and the X-ray Talbot-Lau interferometer using the metal grid 1a will be described.

Figure 17:
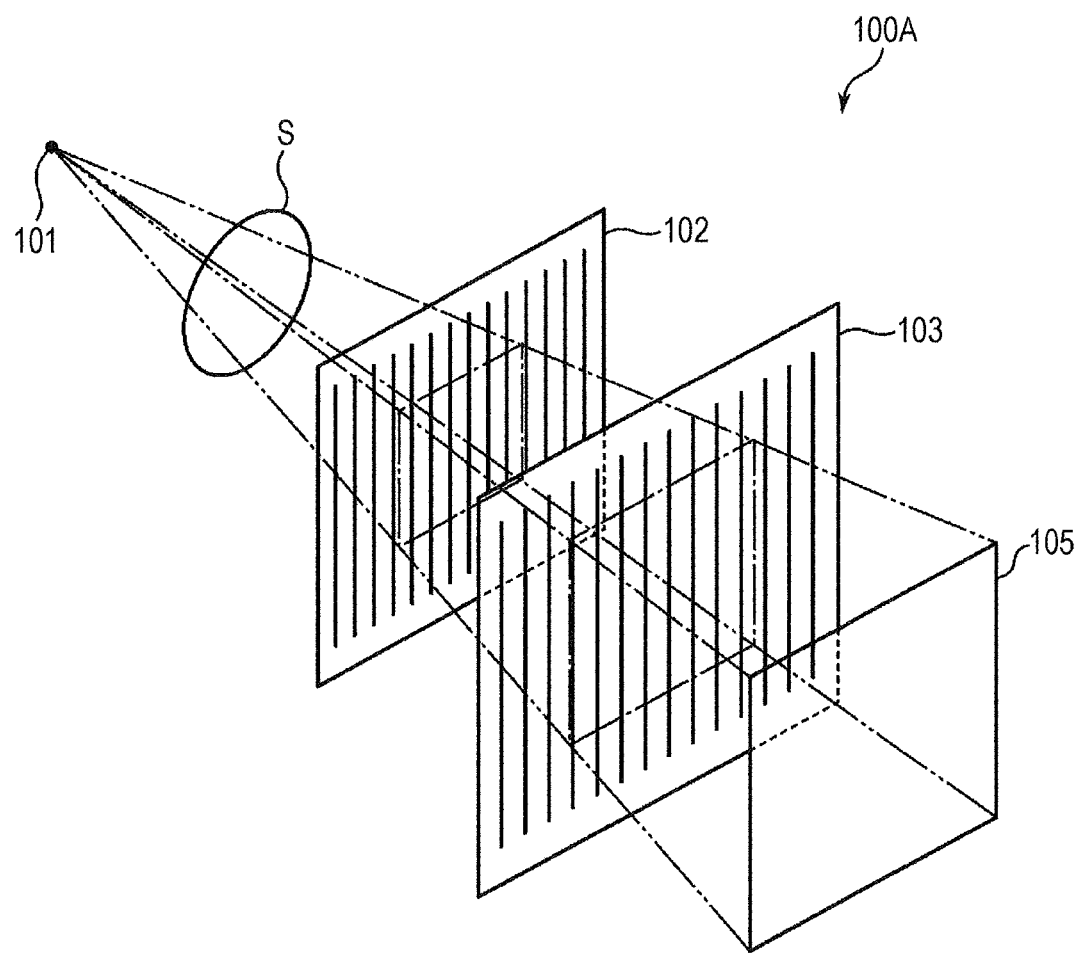
FIG. 17 is a perspective view illustrating a configuration of an X-ray Talbot interferometer according to a second embodiment of the present invention.
Figure 18:
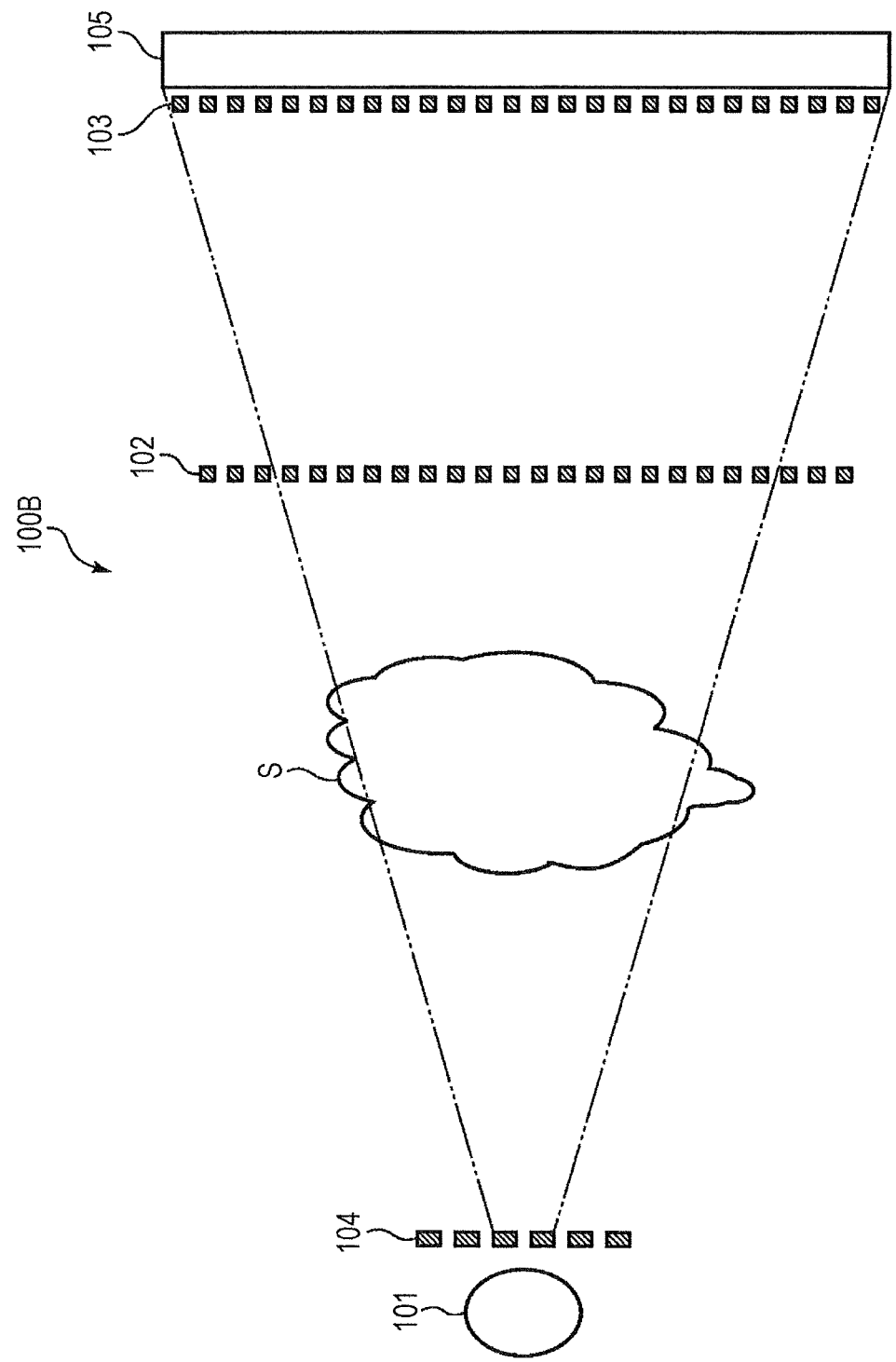
FIG. 18 is a top view illustrating a configuration of an X-ray Talbot-Lau interferometer according to a third embodiment of the present invention.

FIG. 17 is a perspective view illustrating a configuration of an X-ray Talbot interferometer according to a second embodiment. FIG. 18 is a top view illustrating a configuration of an X-ray Talbot-Lau interferometer according to a third embodiment.

As illustrated in FIG. 17, an X-ray Talbot interferometer 100A of the embodiment includes an X-ray source 101 emitting X-rays having a predetermined wavelength, a first diffraction grid 102 having a phase type structure diffracting the X-rays emitted from the X-ray source 101, and a second diffraction grid 103 having an amplitude type structure forming an image contrast by diffracting the X-rays diffracted by the first diffraction grid 102. Here, the first and second diffraction grids 102 and 103 are set to conditions for constituting the X-ray Talbot interferometer. Then, the X-ray forming the image contrast by the second diffraction grid 103 is detected by, for example, an X-ray image detector 105 detecting the X-ray. Moreover, in the X-ray Talbot interferometer 100A, at least one of the first diffraction grid 102 and the second diffraction grid 103 is the X-ray metal grid 1a which is manufactured in accordance with any one of the above-described methods of manufacturing the X-ray metal grid 1a.

The above-described conditions for constituting the Talbot interferometer 100A are expressed by Equations 1 and 2 below. Equation 2 is obtained on the assumption that the first diffraction grid 102 is a phase diffraction grid.

$$l = \lambda/(a/(L+Z1+Z2)) \quad \text{(Equation 1)}$$

$$Z1 = (m+1/2) \times (d2/\lambda) \quad \text{(Equation 2)}$$

Here, l indicates a coherent interference distance, λ indicates the wavelength (which is normally the center wavelength) of the X-ray, a indicates the opening diameter of the X-ray source 101 in a direction substantially orthogonal to the diffraction member of the diffraction grid, L indicates the distance from the X-ray source 101 to the first diffraction grid 102, Z1 indicates the distance from the first diffraction grid 102 to the second diffraction grid 103, Z2 indicates the distance from the second diffraction grid 103 to the X-ray image detector 105, m indicates an integer, and d indicates the period of the diffraction member (the period of the diffraction grid, the grid constant, the distance between the centers of the adjacent diffraction members, and the pitch P).

In the X-ray Talbot interferometer 100A with such a configuration, the X-ray is emitted from the X-ray source 101 toward the first diffraction grid 102. The emitted X-ray causes a Talbot effect by the first diffraction grid 102 to form a Talbot image. The Talbot image is subjected to the action of the second diffraction grid 103 to form a moire fringe image contrast. Then, the image contrast is detected by the X-ray image detector 105.

The Talbot effect means a state in which an image similar to the diffraction grid (the own image of the diffraction grid) is formed by some distance when light is incident to the diffraction grid. Here, the some distance indicates a Talbot distance L and the own image indicates a Talbot image. The Talbot distance L indicates Z1 expressed by Equation 2 above (L=Z1) when the diffraction grid is a phase diffraction grid. The Talbot image is illustrated as a reversed image in the case of the odd times of L (=(2 m+1)L and m is an integer) and is illustrated as a normal image in the case of the even times of L (=2 mL).

Here, when the subject S is disposed between the X-ray source 101 and the first diffraction grid 102, the moire fringe is modulated by the subject S and the modulation amount is proportional to an angle at which the X-ray is bent by the refraction effect of the subject S. For this reason, the subject S and the inner structure thereof are detected by the analysis of the moire fringe.

In the Talbot interferometer 100A having the configuration illustrated in FIG. 17, the X-ray source 101 is a single point light source. Such a single point light source can further include a single slit plate provided with one slit (a single slit) and the X-ray emitted from the X-ray source 101 passes through the single slit of the single slit plate and is emitted toward the first diffraction grid 102 through the subject S. The slit is a thin and elongated rectangular opening which extends in one direction.

Meanwhile, a Talbot-Lau interferometer 100B includes the X-ray source 101, a multi-slit plate 104, the first diffraction grid 102, and the second diffraction grid 103 as illustrated in FIG. 18. That is, the Talbot-Lau interferometer 100B further includes the multi-slit plate 104 in which a plurality of slits are formed in parallel at the X-ray emission side of the X-ray source 101 in addition to the Talbot interferometer 100A illustrated in FIG. 17.

The multi-slit plate 104 is a so-called zeroth grid and may be the X-ray metal grid 1 which is manufactured in accordance with any one of the above-described methods of manufacturing the X-ray metal grid 1. When the multi-slit plate 104 is manufactured in accordance with any one of the above-described methods of manufacturing the X-ray metal grid 1, the X-ray can be reliably blocked by the slit-shaped X-ray absorbing portion 111a while permeating the slit-shaped X-ray permeation portion 112a. Thus, since the permeation and the non-permeation of the X-ray can be more accurately distinguished from each other, the multi-slit plate 104 can reliably emit the X-ray from the X-ray source 101 in the form of the X-ray emitted from a multi-light source.

Then, when the Talbot-Lau interferometer 100B is used, the amount of the X-ray emitted toward the first diffraction grid 102 through the subject S increases compared with the Talbot interferometer 100A and hence more satisfactory moire fringe is obtained.

(Fourth Embodiment: X-ray Imaging Device)

The X-ray metal grid 1a can be used in various optical devices, but since the X-ray absorbing portion 111a can be formed with a high aspect ratio, the X-ray metal grid 1a can be appropriately used in, for example, an X-ray imaging device. Particularly, the X-ray imaging device using the X-ray Talbot interferometer is one of phase contrasting methods of obtaining a permeation image of a subject in such a manner that the X-ray is regarded as a wave and a phase shift of the X-ray caused when the X-ray passes through the subject is detected. Compared with an absorption contrast method of obtaining an image having an X-ray absorption degree caused by a subject as the contrast, the sensitivity is improved by about 1000 times and hence the X-ray irradiation amount can be decreased to, for example, $\frac{1}{100}$ to $\frac{1}{1000}$. In the embodiment, the X-ray imaging device including the X-ray Talbot interferometer using the X-ray metal grid 1a will be described.

Figure 19:
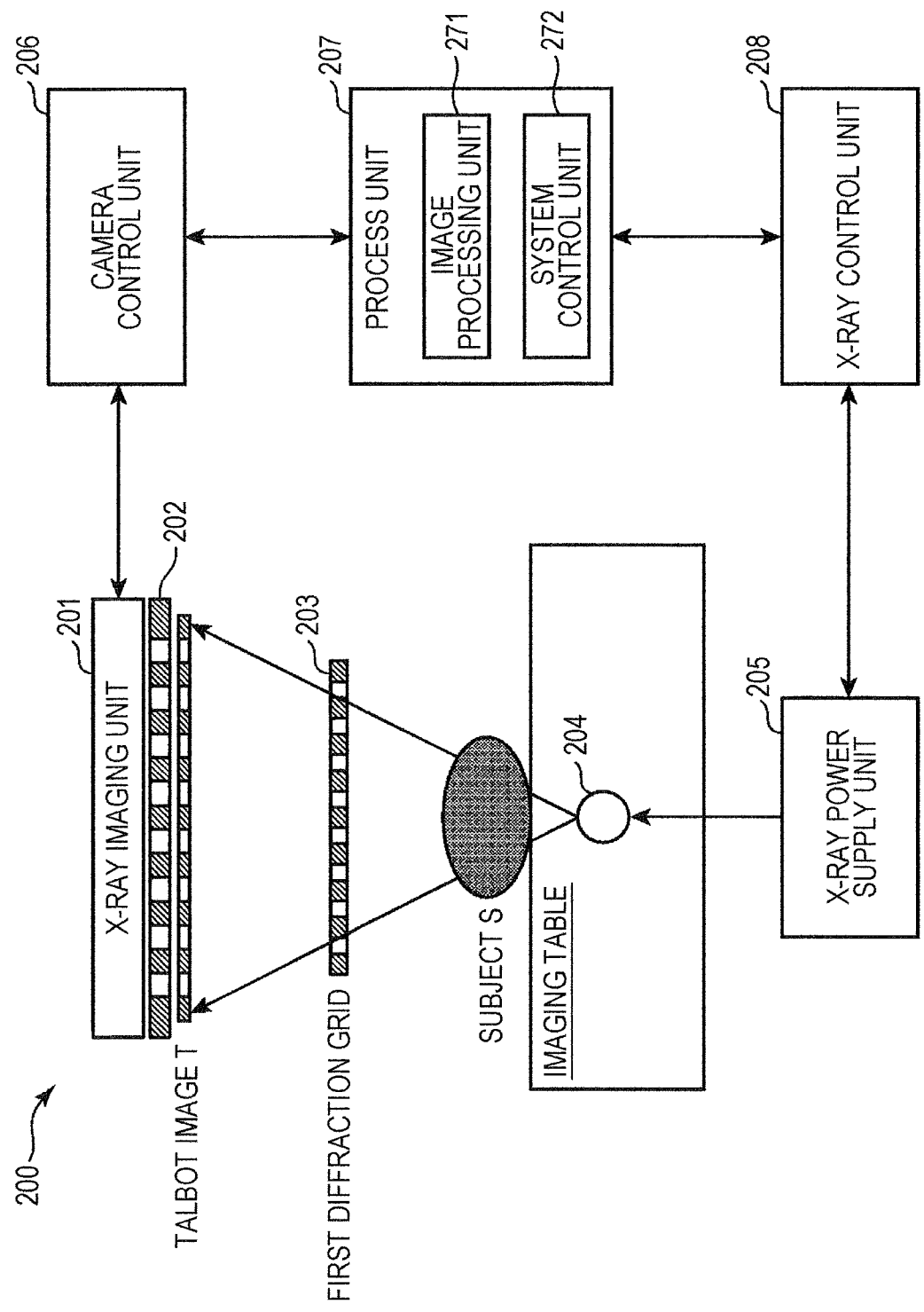
FIG. 19 is an explanatory diagram illustrating a configuration of an X-ray imaging device according to a fourth embodiment of the present invention.

FIG. 19 is an explanatory diagram illustrating a configuration of an X-ray imaging device according to the fourth embodiment. Further, even in FIG. 19, the X-ray permeation portion of the X-ray metal grid is indicated by white. In FIG. 19, an X-ray imaging device 200 includes an X-ray imaging unit 201, a second diffraction grid 202, a first diffraction grid 203, and an X-ray source 204. In the embodiment, the X-ray imaging device 200 further includes an X-ray power supply unit 205 which supplies power to the X-ray source 204, a camera control unit 206 which controls an imaging operation of the X-ray imaging unit 201, a process unit 207 which controls the entire operation of the X-ray imaging device 200, and an X-ray control unit 208 which controls the power supply operation of the X-ray power supply unit 205 to control an X-ray emitting operation of the X-ray source 204.

The X-ray source 204 is a device which emits an X-ray so that the X-ray is emitted toward the first diffraction grid 203 by the power supplied from the X-ray power supply unit 205. The X-ray source 204 is, for example, a device which emits an X-ray in such a manner that a high voltage supplied from the X-ray power supply unit 205 is applied across a cathode and an anode and electrons emitted from a filament of the cathode collide with the anode.

The first diffraction grid 203 is a diffraction grid which causes a Talbot effect by the X-ray emitted from the X-ray source 204. The first diffraction grid 203 is, for example, a diffraction grid which is manufactured by any one of the above-described methods of manufacturing the X-ray metal grid 1. The first diffraction grid 203 is a grid which is configured to satisfy a condition of causing a Talbot effect and is sufficiently larger than the wavelength of the X-ray emitted from the X-ray source 204. For example, a phase diffraction grid can be used of which a grid constant (a period of the diffraction grid) d is about 20 times or more the wavelength of the X-ray. Further, the first diffraction grid 203 may be such an amplitude-type diffraction grid.

The second diffraction grid 202 is a permeation-type amplitude-type diffraction grid which is disposed at a position separated from the first diffraction grid 203 by a substantial Talbot distance L and diffracts the X-ray diffracted by the first diffraction grid 203. The second diffraction grid 202 is also, for example, a diffraction grid which is manufactured in accordance with any one of the above-described methods of manufacturing the X-ray metal grid 1 similarly to the first diffraction grid 203.

These first and second diffraction grids 203 and 202 are set to the conditions for constituting the Talbot interferometer expressed by Equations 1 and 2 above.

The X-ray imaging unit 201 is a device which images an X-ray image diffracted by the second diffraction grid 202. The X-ray imaging unit 201 is, for example, a flat panel detector (FPD) which includes a two-dimensional image sensor having a thin film layer with a scintillator absorbing the energy of an X-ray and emitting fluorescent light formed on a light receiving surface or an image intensifier camera which includes an image intensifier unit converting incident photons into electrons in a photoelectric surface, increasing twofold the electrons by a micro channel plate, and causing the twofold increased electron group to collide with a fluorescent body so that light is emitted and a two-dimensional image sensor imaging light output from the image intensifier unit.

The process unit 207 is a device which controls the components of the X-ray imaging device 200 to control the entire operation of the X-ray imaging device 200 and includes, for example, a microprocessor and a peripheral circuit thereof. Functionally, the process unit 207 includes an image processing unit 271 and a system control unit 272.

The system control unit 272 transmits and receives a control signal to and from the X-ray control unit 208 to control the X-ray emitting operation in the X-ray source 204 through the X-ray power supply unit 205 and transmits and receives a control signal to and from the camera control unit 206 to control the imaging operation of the X-ray imaging unit 201. By the control of the system control unit 272, the X-ray is emitted toward the subject S and an image formed by the emission of the X-ray is obtained by the X-ray imaging unit 201. Then, an image signal is input to the process unit 207 through the camera control unit 206.

The image processing unit 271 processes the image signal generated by the X-ray imaging unit 201 to create an image of the subject S.

Next, an operation of the X-ray imaging device of the embodiment will be described. When the subject S is placed on, for example, an imaging table having the X-ray source 204 provided at the inside (the rear side) thereof, the subject S is disposed between the X-ray source 204 and the first diffraction grid 203. Then, when an operation of imaging the subject S is instructed from an operation unit (not illustrated) by a user (an operator) of the X-ray imaging device 200, the system control unit 272 of the process unit 207 outputs a control signal to the X-ray control unit 208 to emit the X-ray toward the subject S. By the control signal, the X-ray control unit 208 supplies power from the X-ray power supply unit 205 to the X-ray source 204 and the X-ray source 204 emits the X-ray so that the X-ray is emitted toward the subject S.

The emitted X-ray passes through the first diffraction grid 203 through the subject S and is diffracted by the first diffraction grid 203 so that a Talbot image T as the own image of the first diffraction grid 203 is formed at a position separated by the Talbot distance L (=Z1).

The formed X-ray Talbot image T is diffracted by the second diffraction grid 202 to cause moire so that a moire fringe image is formed. The moire fringe image is obtained by the X-ray imaging unit 201 in which, for example, the exposure time or the like is controlled by the system control unit 272.

The X-ray imaging unit 201 outputs an image signal of a moire fringe image to the process unit 207 through the camera control unit 206. This image signal is processed by the image processing unit 271 of the process unit 207.

Here, since the subject S is disposed between the X-ray source 204 and the first diffraction grid 203, the phase of the X-ray passing through the subject S is deviated from the phase of the X-ray not passing through the subject S. For this reason, the wave surface of the X-ray incident to the first diffraction grid 203 is distorted and hence the Talbot image T is deformed. Accordingly, the moire fringe of the image obtained by overlapping the Talbot image T and the second diffraction grid 202 is modulated by the subject S and the modulation amount is proportional to an angle at which the X-ray is bent by the refraction effect of the subject S. Thus, the subject S and the inner structure thereof can be detected by the analysis of the moire fringe. Further, when the subject S is imaged from a plurality of angles, a tomographic image of the subject S can be formed by an X-ray phase CT (Computed Tomography).

Then, since the second diffraction grid 202 of the embodiment is the X-ray metal grid 1 including the X-ray absorbing portion 111a having a high aspect ratio of the above-described embodiment, a satisfactory moire fringe is obtained and hence a high-precise image of the subject S is obtained.

In addition, the X-ray imaging device 200 has a configuration in which the X-ray source 204, the first diffraction grid 203, and the second diffraction grid 202 constitute the Talbot interferometer. However, the Talbot-Lau interferometer may be obtained when the X-ray metal grid 1 of the above-described embodiment is further disposed as a multi-slit at the X-ray emission side of the X-ray source 204. By using such a Talbot-Lau interferometer, the amount of the X-ray emitted to the subject S can be increased compared with the case of the single slit. Accordingly, more satisfactory moire fringe is obtained and hence a higher-precision image of the subject S is obtained.

Further, in the X-ray imaging device 200, the subject S is disposed between the X-ray source 204 and the first diffraction grid 203, but the subject S maybe disposed between the first diffraction grid 203 and the second diffraction grid 202.

Further, in the X-ray imaging device 200, the X-ray image is obtained by the X-ray imaging unit 201 to obtain electronic data of the image, but may be obtained by an X-ray film.

As described above, the X-ray imaging device of the embodiment can be understood as below. That is, the X-ray imaging device includes an X-ray source which emits an X-ray, a Talbot interferometer or a Talbot-Lau interferometer which emits the X-ray emitted from the X-ray source, and an X-ray imaging element which obtains an X-ray image by the Talbot interferometer or the Talbot-Lau interferometer, and the Talbot interferometer or the Talbot-Lau interferometer includes an X-ray metal grid which is manufactured in accordance with the method of manufacturing a high aspect ratio structure.

Since such an X-ray imaging device uses the above-described metal grid having higher performance in the X-ray metal grid constituting the Talbot interferometer or the Talbot-Lau interferometer, a more clear X-ray image can be obtained.

(Fifth Embodiment: Method of Manufacturing Ultrasonic Probe)

An ultrasonic probe which is used in a nondestructive inspection test (NDT) or a medical field generally uses a single active element (a piezoelectric element which sends and receives a high-frequency sonic wave). On the contrary, a phased array system is configured as a probe including a plurality of (for example, 16 to 256 in maximum) piezoelectric elements capable of individually oscillating pulse. Then, when the strengths and the phases of the ultrasonic waves emitted from the piezoelectric elements are individually and electrically controlled, the propagation direction or the focal point range of the ultrasonic wave can be changed arbitrarily.

Hereinafter, a method of manufacturing a phased array ultrasonic probe by the high aspect ratio structure of the present invention will be described.

Figure 20:
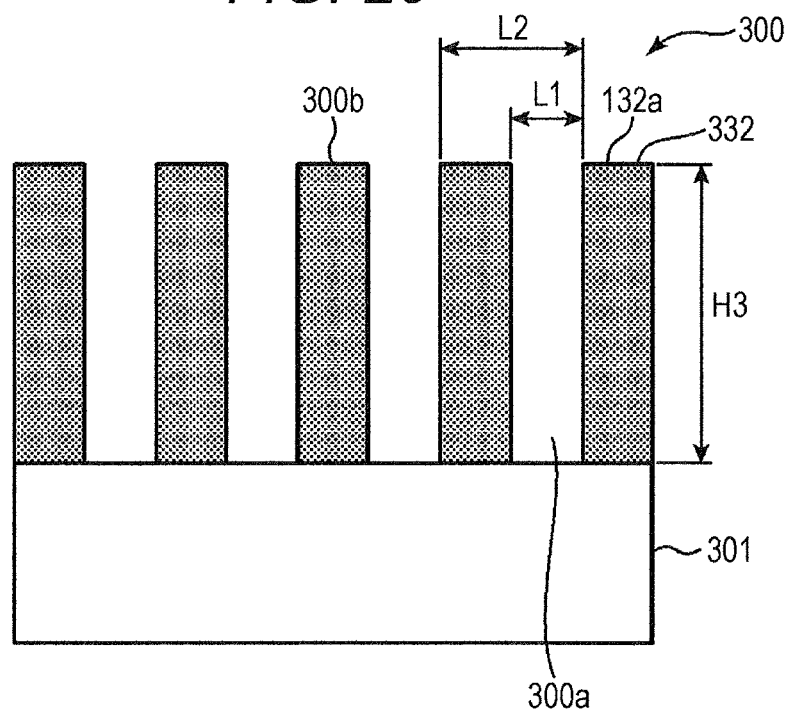
FIG. 20 is a cross-sectional view illustrating an ultrasonic probe manufacturing mold according to a sixth embodiment of the present invention as an example manufactured by the method of manufacturing a high aspect ratio structure according to the embodiment of the present invention.

Similarly to the case of manufacturing the X-ray metal grid according to the first embodiment, as illustrated in FIG. 20, an ultrasonic probe manufacturing mold 300 as a high aspect ratio structure corresponding to a one-dimensional structure is manufactured in which a concave portion 300a having a width L1 of 15 μm and a depth H3 of 100 μm is continuously disposed at a pitch interval L2 of 30 μm (=a period of 30 μm) in a principal surface with a hole group 332 in a substrate 301 formed of aluminum.

Figure 21:
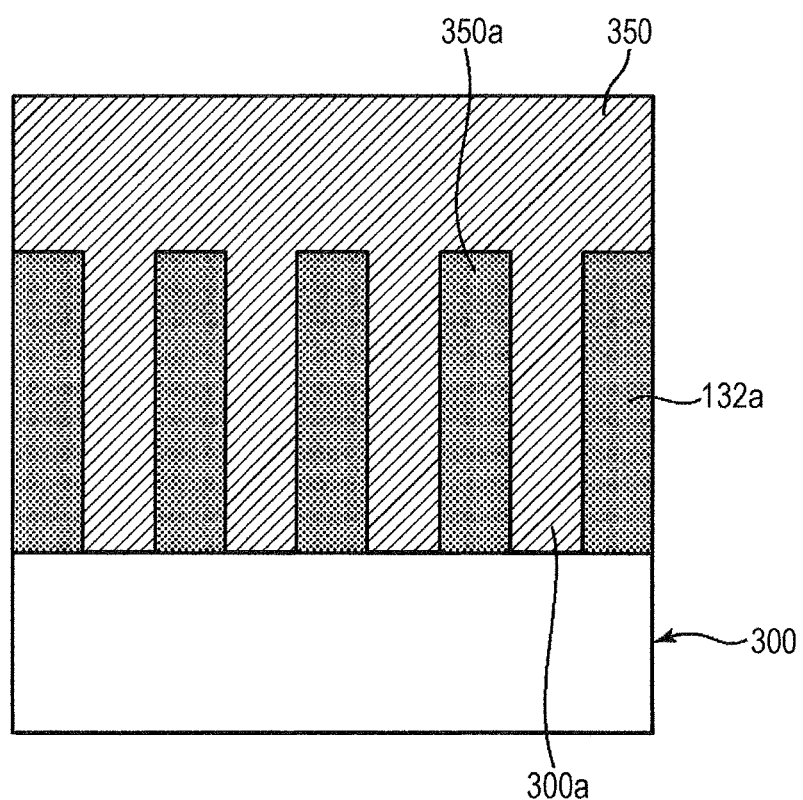
FIG. 21 is a cross-sectional view illustrating a case in which a metal mold is formed by an ultrasonic probe manufacturing mold manufactured by the method of manufacturing a high aspect ratio structure according to the embodiment of the present invention.
Figure 22:
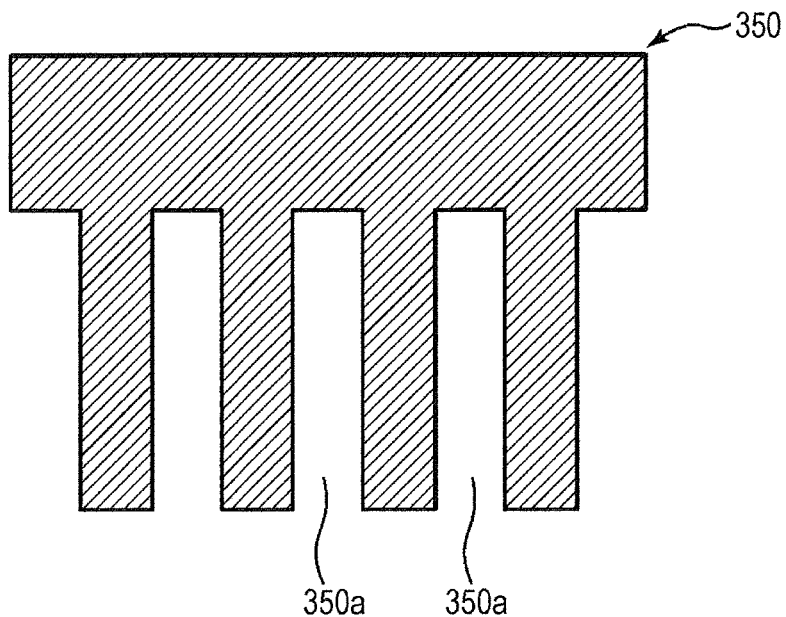
FIG. 22 is a cross-sectional view illustrating the metal mold of FIG. 21.

Next, as illustrated in FIG. 21, the substrate 301 of the bottom portion of the concave portion 300a of the ultrasonic probe manufacturing mold 300 is plated as a plating electrode and a nickel filling material including nickel is charged into the concave portion 300a to be accumulated to a thickness of 1 mm. Next, the ultrasonic probe manufacturing mold 300 is dissolved and removed by a phosphoric acid solution to obtain a metal mold 350 including a metal mold concave portion 350*a* as illustrated in FIG. 22 (a metal mold forming step).

Figure 23:
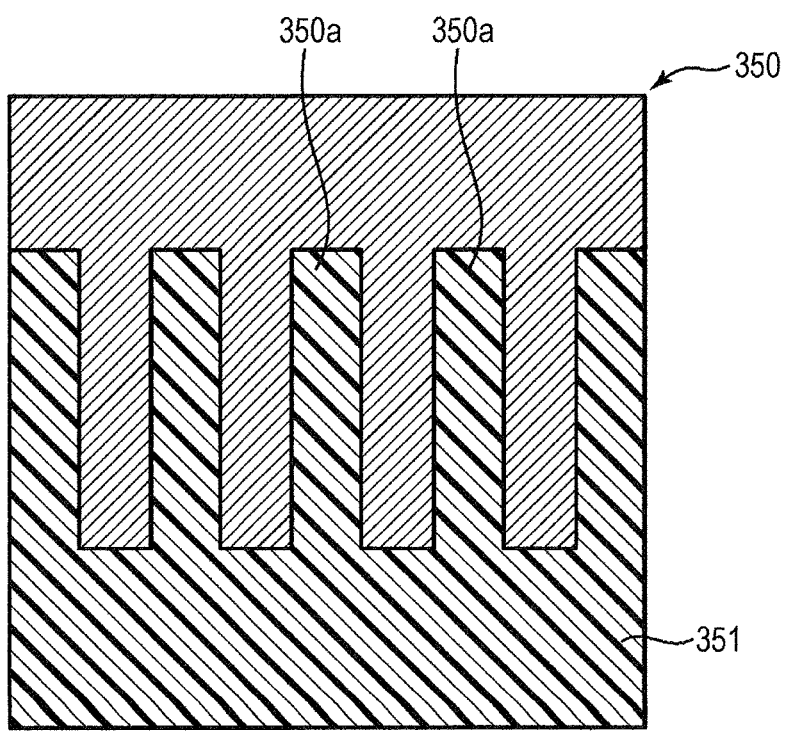
FIG. 23 is a cross-sectional view illustrating a case in which a resin mold is formed by using the metal mold of FIG. 21.
Figure 24:
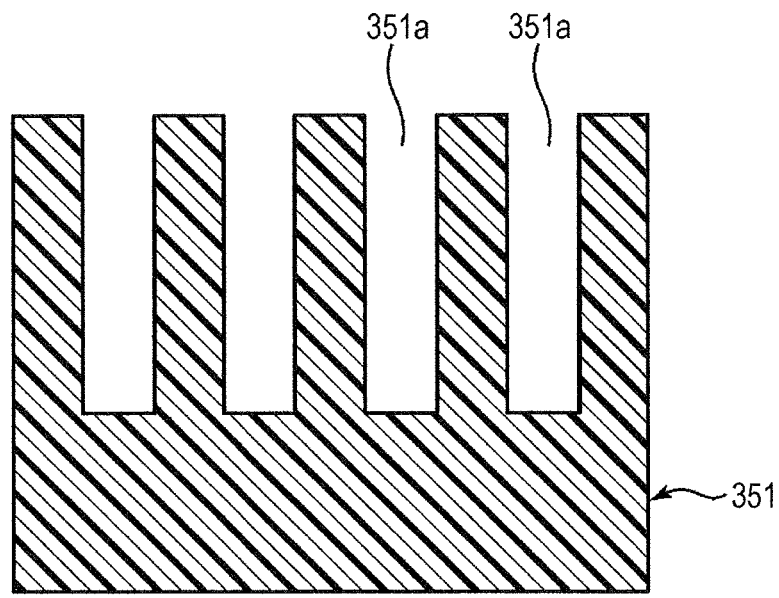
FIG. 24 is a cross-sectional view illustrating the resin mold of FIG. 23.

Next, as illustrated in FIG. 23, resin filler including a resin material is charged into the obtained metal mold 350. As the resin material, acrylic resin formed of polymethyl methacrylate (PMMA) is used. Syrup-like acrylic resin softened by heating is caused to flow into the metal mold concave portion 350*a* of the metal mold 350, cooled to room temperature and cured, and then the resin material is separated from the metal mold 350 to obtain a resin mold 351 including a resin mold concave portion 351*a* as illustrated in FIG. 24 (a resin mold forming step).

Figure 25:
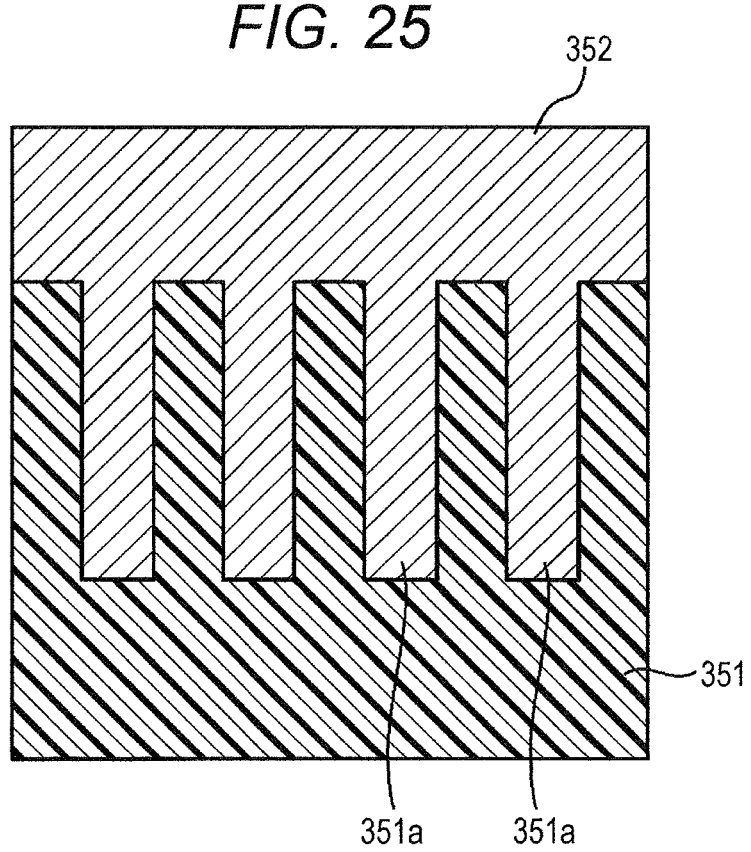
FIG. 25 is a cross-sectional view illustrating a case in which a zirconate titanate sintered body is formed by using the resin mold of FIG. 24.
Figure 26:
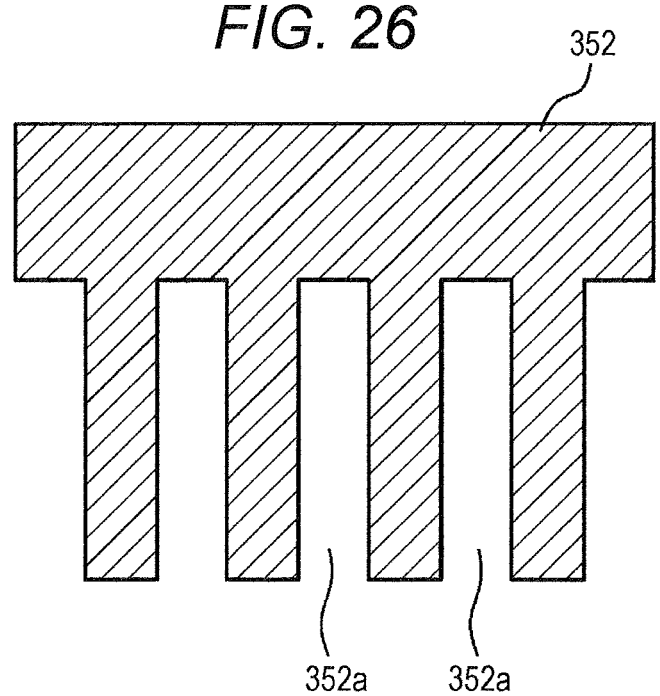
FIG. 26 is a cross-sectional view illustrating the zirconate titanate sintered body of FIG. 25.

Next, as illustrated in FIG. 25, slurry including lead zirconate titanate (PZT) particles is charged into the resin mold concave portion 351*a* of the resin mold 351. The slurry is prepared by using water and organic binder. Next, the charged slurry is solidified by drying. Then, the resin mold 351 is removed by ashing using oxygen plasma (FIG. 26). Next, the solidified material of the remaining slurry is temporarily fired at 500° C. and is mainly fired again at 1100° C. Due to the firing, as illustrated in FIG. 26, a lead zirconate titanate (PZT) sintered body 352 as a piezoelectric material having a microscopic structure with a sintered body concave portion (a structure concave portion) 352*a* is obtained (a microscopic structure forming step).

Figure 27:
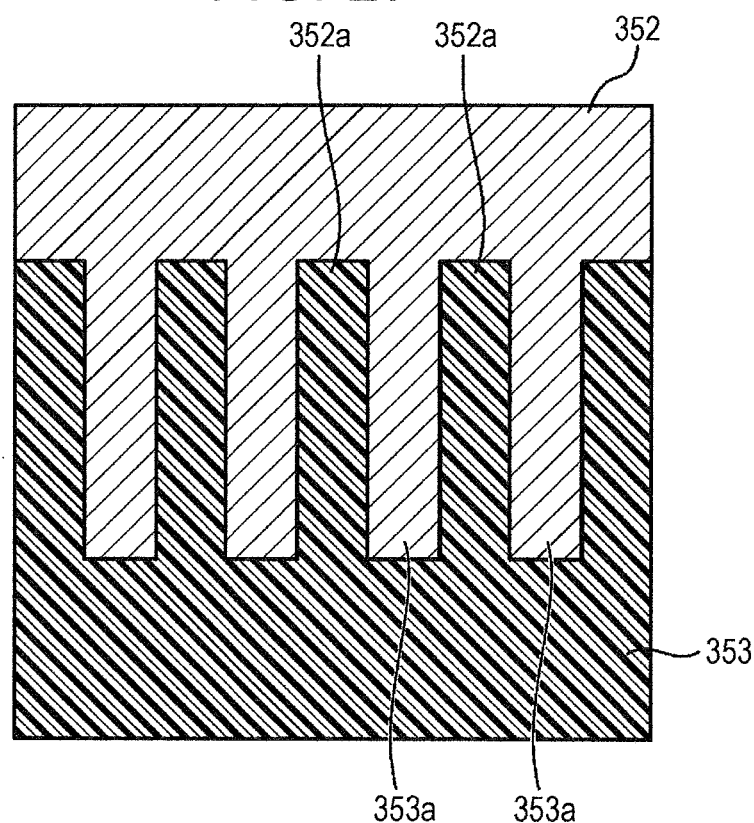
FIG. 27 is a cross-sectional view illustrating a case in which epoxy resin is charged into a sintered body concave portion formed in the zirconate titanate sintered body of FIG. 26.
Figure 28:
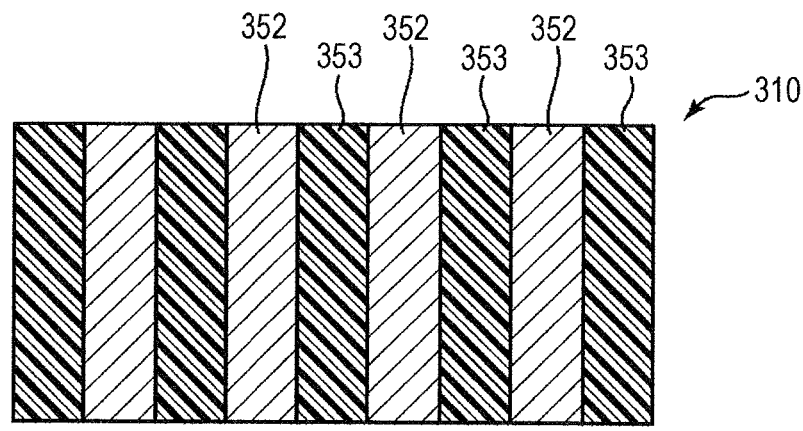
FIG. 28 is a cross-sectional view illustrating a main part of an ultrasonic probe formed from the state of FIG. 27.
Figures 29A, 29B, 29C:
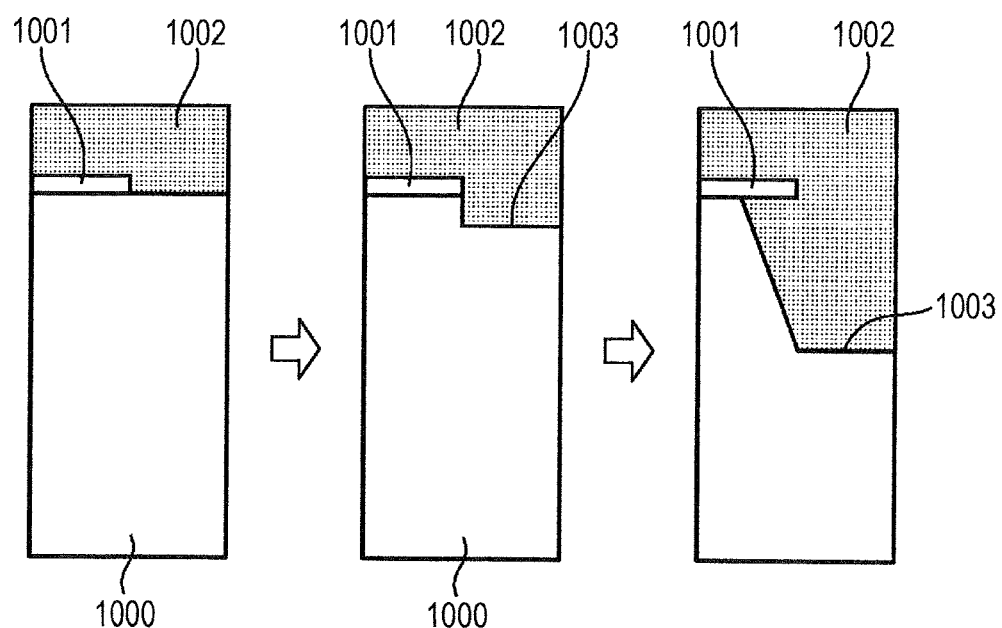
FIGS. 29A to 29C are explanatory diagrams illustrating a case in which a grid is made by wet etching in the related art.

As illustrated in FIG. 27, epoxy resin 353 is charged into the sintered body concave portion 352*a* of the lead zirconate titanate sintered body 352 manufactured in this way. Next, as illustrated in FIG. 28, the pedestal portions of the epoxy resin 353 and the lead zirconate titanate sintered body 352 are removed by polishing to form an ultrasonic probe body 310 in which the lead zirconate titanate sintered body 352 and the epoxy resin 353 are alternately arrayed (an ultrasonic probe body forming step). Next, an electrode is formed on both surfaces of the ultrasonic probe body 310 to obtain an ultrasonic probe.

As described above, the ultrasonic probe manufacturing mold 300 as the high aspect ratio structure used in the method of manufacturing an ultrasonic probe is formed by wet etching so that the plurality of concave portions 300*a* formed in one principal surface of the substrate 301 respectively include side surfaces perpendicular to the principal surface of the substrate 301. Then, since the ultrasonic probe body 310 is manufactured based on the ultrasonic probe manufacturing mold 300 in the method of manufacturing an ultrasonic probe, the lead zirconate titanate sintered body 352 and the epoxy resin 353 can be accurately alternately arrayed and hence the ultrasonic probe body 310 can be manufactured at a low cost.

In order to express the present invention, the embodiments of the present invention have been described appropriately and sufficiently with reference to the above-described drawings. However, it should be recognized that the above-described embodiments can be modified and/or improved by the person skilled in the art. Thus, it is understood that the modification or the improvement made by the person skilled in the art is included in the scope of claims as long as the modification or the improvement does not depart from the scope of claims.

Although the present invention has been described and illustrated in detail, it is clearly understood that the same is by way of illustrated and example only and is not to be taken byway of limitation, the scope of the present invention being interpreted by terms of the appended claims.

What is claimed is:

1. A method of manufacturing a high aspect ratio structure comprising:
   a hole forming step of forming a plurality of holes in at least one principal surface of a substrate;
   a resist forming step of forming a first area with a resist layer and a second area without the resist layer on the principal surface provided with the plurality of holes after the hole forming step ends; and
   a concave portion forming step of immersing the substrate into an etching solution to form a concave portion in the substrate corresponding to the second area, and
   an X-ray absorbing material burying step of burying an X-ray absorbing material capable of absorbing an X-ray into the concave portion,
   wherein the hole forming step is performed by an anode oxidation treatment or an anode forming treatment,
   wherein the substrate is formed of aluminum, tungsten, molybdenum, silicon, gallium arsenide, or indium-phosphorus,
   wherein, in the concave portion forming step, parts where the plurality of holes are formed are removed to expose the substrate through the concave portion, and
   wherein, in the X-ray absorbing material burying step, metal as the X-ray absorbing material is buried from the exposed substrate by electroforming.

2. The method of manufacturing a high aspect ratio structure according to claim 1, wherein
   the high aspect ratio structure is an X-ray metal grid used in an X-ray Talbot interferometer or an X-ray Talbot-Lau interferometer.

3. The method of manufacturing a high aspect ratio structure according to claim 1, wherein
   the high aspect ratio structure is an ultrasonic probe manufacturing mold used when an ultrasonic probe is manufactured.

4. A method of manufacturing an ultrasonic probe comprising:
   a metal mold forming step of charging metal into the concave portion of the ultrasonic probe manufacturing mold of claim 3 to form a metal mold with a metal mold concave portion;
   a resin mold forming step of charging resin filler formed of a resin material into the metal mold concave portion of the metal mold to form a resin mold with a resin mold concave portion;
   a microscopic structure forming step of charging slurry including a piezoelectric material into the resin mold concave portion of the resin mold to form a microscopic structure with a structure concave portion; and
   an ultrasonic probe body forming step of charging synthetic resin into the structure concave portion of the microscopic structure to form an ultrasonic probe body in which a piezoelectric layer formed of a piezoelectric material and a synthetic resin layer formed of synthetic resin are arrayed alternately.

* * * * *